(12) United States Patent
Ma

(10) Patent No.: US 9,143,267 B2
(45) Date of Patent: Sep. 22, 2015

(54) LOW COMPLEXITY AND POWER EFFICIENT ERROR CORRECTION CODING SCHEMES

(75) Inventor: Xudong Ma, North York (CA)

(73) Assignee: Empire Technology Development LLC, Wilmington, DE (US)

( * ) Notice: Subject to any disclaimer, the term of this patent is extended or adjusted under 35 U.S.C. 154(b) by 341 days.

(21) Appl. No.: 13/500,542

(22) PCT Filed: Oct. 27, 2011

(86) PCT No.: PCT/US2011/058002
§ 371 (c)(1),
(2), (4) Date: Apr. 5, 2012

(87) PCT Pub. No.: WO2013/062548
PCT Pub. Date: May 2, 2013

(65) Prior Publication Data
US 2013/0111291 A1    May 2, 2013

(51) Int. Cl.
*H03M 13/00* (2006.01)
*H04L 1/00* (2006.01)
(Continued)

(52) U.S. Cl.
CPC ............. *H04L 1/0009* (2013.01); *H03M 13/35* (2013.01); *H03M 13/3707* (2013.01);
(Continued)

(58) Field of Classification Search
CPC ..... H04L 1/0009; H04L 1/243; H04L 1/0057; H04L 1/0026; H04L 1/0041; H04L 1/0042; H04L 1/0081; H04L 25/03019; H03M 13/35; H03M 3/484; H03M 13/3707; G06F 11/1012; G06F 11/1048

USPC ................. 714/752, 774, 750, 746, 748, 776
See application file for complete search history.

(56) References Cited

U.S. PATENT DOCUMENTS 6,039,688 A     3/2000    Douglas et al.
6,460,158 B1 *   10/2002    Baggen ......................... 714/774
(Continued)

FOREIGN PATENT DOCUMENTS

| JP | 01-205641 A | 2/1989 |
|---|---|---|
| JP | 2000-349742 | 12/2000 |

(Continued)

OTHER PUBLICATIONS

International Search Report and Written Opinion dated Jan. 24, 2012 in PCT Application No. PCT/US11/58002.
(Continued)

*Primary Examiner* — Esaw Abraham
*Assistant Examiner* — Osman Alshack
(74) *Attorney, Agent, or Firm* — Turk IP Law, LLC

(57) ABSTRACT

Technologies are generally described herein for adapting an error correction coding scheme. Some example technologies may receive a message. The technologies may generate a portion of a codeword by encoding the message based on the error correction coding scheme. The technologies may transmit a copy of the portion of the codeword from a transmitter to a receiver via a feedforward communications channel. The technologies may generate feedback based on the copy of the portion of the codeword. The technologies may transmit a copy of the feedback from the receiver to the transmitter via a feedback communications channel. The technologies may generate an adapted error correction coding scheme by adjusting the error correction coding scheme based on the copy of the feedback.

32 Claims, 10 Drawing Sheets

(51) Int. Cl.
| | |
|---|---|
| H03M 13/35 | (2006.01) |
| H03M 13/37 | (2006.01) |
| G06F 11/10 | (2006.01) |
| H04L 1/24 | (2006.01) |

(52) U.S. Cl.
CPC .......... *H04L 1/0026* (2013.01); *H04L 1/0041* (2013.01); *G06F 11/1012* (2013.01); *G06F 11/1048* (2013.01); *H04L 1/0057* (2013.01); *H04L 1/243* (2013.01)

(56) References Cited

U.S. PATENT DOCUMENTS

| | | | |
|---|---|---|---|
| 6,865,233 | B1 | 3/2005 | Eriksson et al. |
| 6,938,195 | B1 | 8/2005 | Shi et al. |
| 7,203,182 | B2 * | 4/2007 | Hwang .................. 370/338 |
| 2004/0228320 | A1 * | 11/2004 | Laroia et al. ............. 370/349 |
| 2005/0013249 | A1 * | 1/2005 | Kong et al. .............. 370/235 |
| 2008/0177570 | A1 | 7/2008 | Craine |
| 2008/0227495 | A1 * | 9/2008 | Kotecha et al. ........... 455/562.1 |
| 2009/0102681 | A1 * | 4/2009 | Brennan et al. .......... 340/870.03 |
| 2009/0274230 | A1 * | 11/2009 | Heath et al. .............. 375/260 |
| 2009/0285325 | A1 * | 11/2009 | Zhou ...................... 375/267 |
| 2009/0287947 | A1 * | 11/2009 | DuBose .................. 713/323 |
| 2010/0074208 | A1 * | 3/2010 | Farajidana et al. ........ 370/329 |
| 2010/0183090 | A1 * | 7/2010 | Abbasfar et al. .......... 375/296 |
| 2010/0304691 | A1 * | 12/2010 | Goransson et al. ........ 455/69 |
| 2011/0149836 | A1 | 6/2011 | Hong et al. |
| 2011/0243207 | A1 * | 10/2011 | Tang et al. ............... 375/224 |
| 2012/0011413 | A1 * | 1/2012 | Liu et al. ................. 714/746 |
| 2012/0033566 | A1 * | 2/2012 | Porat et al. ............... 370/252 |
| 2012/0320994 | A1 * | 12/2012 | Loghin et al. ............ 375/240.27 |

FOREIGN PATENT DOCUMENTS

| | | |
|---|---|---|
| JP | 2002-537722 A | 11/2002 |
| WO | 2009134220 A1 | 11/2009 |
| WO | 2011104182 A2 | 9/2011 |

OTHER PUBLICATIONS

Arikan, E., "Channel Polarization: A Method for Constructing Capacity-Achieving Codes for Symmetric Binary-Input Memoryless Channels," IEEE Transactions on Information Theory, Jul. 2009.

Arikan, E. et al., "On the Rate of Channel Polarization," IEEE International Symposium on Information Theory, 2009. ISIT 2009. Jun. 28, 2009-Jul. 3, 2009.

Berrou, C. et al., "Near Shannon Limit Error-Correcting Coding and Decoding: Turbo Codes (1)," IEEE International Conference on Communications '93, May 23-26, 1993, Geneva, Switzerland, Technical Program, Conference Record, vol. 2/3, pp. 1064-1070.

Bose, R.C. et al., "On a Class of Error Correcting Binary Group Codes," Information and Control 3, 68-79. 1960.

Burnashev, M.V., "Data Transmission over a Discrete Channel with Feedback. Random Transmission Time," Probl. Peredachi Inf., 1976, 12:4, pp. 10-30. 1976. Abstract only.

Caire, G. et al., "Feedback and Belief Propagation," 4th International Symposium on Turbo Codes & Related Topics; 6th International ITG-Conference on Source and Channel Coding. 2006.

Divsalar, D. et al., "Multiple Turbo Codes for Deep-Space Communications," TDA Progress Report 42-120, 1995.

Elias, P., "Error-Free Coding," IRE Transactions on Information Theory, vol. 4, Technical Report 285, Sep. 22, 1954.

Eslami, A. et al., "Performance of Polar Codes Under Belief Propagation Decoding," [http://www.itsoc.org/school2010/files/poster/Performance%20of%20Polar%20Codes%20under%20Belief%20Propagation%20Decoding.pdf] Accessed Dec. 14, 2010.

Gallager, R.G., "Low-Density Parity-Check Codes," IRE Transactions on Information Theory, vol. 8, pp. 21-28, Jan. 1962.

Hocquenghem, A., "Codes Correcteurs d'erreurs," Chiffres (Paris) vol. 2, pp. 147-156, Sep. 1959.

Hussami, N. et al., "Performance of Polar Codes for Channel and Source Coding," Proceedings of IEEE International Symposium on Information Theory 2009.

MacKay, D., "Good Error-Correcting Codes Based on Very Sparse Matrices," IEEE Transactions on Information Theory, vol. 42, No. 2, Mar. 1999.

Moon, T.K., "Error Correction Coding: Mathematical Methods and Algorithms," published by John Wiley & Sons, Inc., Hoboken, New Jersey, 2005.

Reed, I.S. et al., "Polynomial Codes Over Certain Finite Fields," Journal of the Society for Industrial and Applied Mathematics, vol. 8, No. 2, pp. 300-304, Jun. 1960.

Schalkwijk, J. et al., "A Coding Scheme for Additive Noise Channels with Feedback: No Badnwidth Constraint," IEEE Transactions on Information Theory, vol. 12, No. 2, pp. 172-182, Apr. 1966.

Shannon, C.E., "A Mathematical Theory of Communication," Bell System Technical Journal, vol. 27, pp. 379-423 and 623-656, Jul. and Oct. 1948.

Miller, J., "SHANNON, Coding and the radio amateur," AMSAT-UK's Oscar News, No. 81, pp. 11-15 (Feb. 1990).

Yamamoto, H. and Itoh, K., "Asymptotic performance of a modified Schalkwijk-Barron scheme or channels with noiseless feedback (Corresp.)," IEEE Transactons on Information Theory, vol. 25, Issue 6, pp. 729-733 (1979).

Lucent Technologies, "Adaptive HARQ proposal for HSDPA" TSG-RAN Working Group 1#19 Mar. 2, 2014, Las Vegas USA.

Erdal Ankan, "A Performance Comparison of Polar Codes and Reed-Muller Codes" IEEE Communications Letters vol. 12, No. 6, Jun. 2008.

* cited by examiner

904 AT LEAST ONE OF

ONE OR MORE INSTRUCTIONS FOR RECEIVING A MESSAGE;

ONE OR MORE INSTRUCTIONS FOR GENERATING A PORTION OF A CODEWORD BY ENCODING THE MESSAGE BASED ON THE ERROR CORRECTION CODING SCHEME;

ONE OR MORE INSTRUCTIONS FOR TRANSMITTING A COPY OF THE PORTION OF THE CODEWORD FROM A TRANSMITTER TO A RECEIVER VIA A FEEDFORWARD COMMUNICATIONS CHANNEL;

ONE OR MORE INSTRUCTIONS FOR GENERATING FEEDBACK BASED ON THE COPY OF THE PORTION OF THE CODEWORD;

ONE OR MORE INSTRUCTIONS FOR TRANSMITTING A COPY OF THE FEEDBACK FROM THE RECEIVER TO THE TRANSMITTER VIA A FEEDBACK COMMUNICATIONS CHANNEL; OR

ONE OR MORE INSTRUCTIONS FOR GENERATING AN ADAPTED ERROR CORRECTION CODING SCHEME BY ADJUSTING THE ERROR CORRECTION CODING SCHEME BASED ON THE COPY OF THE FEEDBACK

*Fig. 9B*

LOW COMPLEXITY AND POWER EFFICIENT ERROR CORRECTION CODING SCHEMES

CROSS-REFERENCE TO RELATED APPLICATIONS

This Application is the National Stage filing under 35 U.S.C. §371 of PCT Application Ser. No. PCT/US11/58002 filed on Oct. 27, 2011. The PCT Application is herein incorporated by reference in its entirety.

BACKGROUND

Unless otherwise indicated herein, the materials described in this section are not prior art to the claims in this application and are not admitted to be prior art by inclusion in this section.

Communications systems may be designed to operate at error probabilities below a threshold level in order to provide a certain quality of service. In one example, such systems may provide certain quality of service for voice communications when bit error probabilities are below $10^{-3}$. In another example, such systems may provide certain quality of service for video communications when block error probabilities are below $10^{-5}$.

During the early years of the telecommunications industry, communications providers would typically decrease error probabilities by increasing transmission power. In 1948, Claude Shannon published his work on channel coding theorems and theorized that better error probability to power tradeoffs (i.e., lower error probability using less transmission power) are achievable by implementing error correction codes. Since that time, various error correction coding schemes have been developed that achieve increasingly better error probability to power tradeoffs. However, existing error correction coding schemes may be not be suitable for some modern applications, such as ubiquitous computing systems, satellite communications, and mobile communications.

SUMMARY

The present disclosure generally describes techniques for adapting an error correction coding scheme. Some example methods may include receiving a message. Example methods may also include generating a portion of a codeword by encoding the message based on the error correction coding scheme and transmitting a copy of the portion of the codeword from a transmitter to a receiver via a feedforward communications channel. Example methods may further include generating feedback based on the copy of the portion of the codeword and transmitting a copy of the feedback from the receiver to the transmitter via a feedback communications channel. In addition, example methods may include generating an adapted error correction coding scheme by adjusting the error correction coding scheme based on the copy of the feedback.

The present disclosure generally also describes some systems for adapting an error correction coding scheme. Some example systems may include a transmitter comprising an encoding device and a coding scheme designer. Example systems may also include a receiver comprising a decoding device and a feedback signal generator. The receiver may be coupled to the transmitter via a feedforward communications channel and a feedback communications channel. The encoding device may be configured to receive a message, generate a portion of a codeword by encoding the message based on the error correction coding scheme, transmit a copy of the portion of the codeword to the decoding device and the feedback signal generator via the feedforward communications channel, receive an adaptive parameter selection signal from the coding scheme designer, and generate an adapted error correction coding scheme by adjusting a parameter of the error correction coding scheme according to the adaptive parameter selection signal. The decoding device may be configured to receive the copy of the portion of the codeword from the encoding device via the feedforward communications channel and generate a decoded message by decoding the codeword based on the error correction coding scheme. The feedback signal generator may be configured to receive the copy of the portion of the codeword from the encoding device via the feedforward communications channel, generate feedback based on the copy of the portion of the codeword, and transmit a copy of the feedback to the coding scheme designer via the feedback communications channel. The coding scheme designer may be configured to receive the copy of the feedback from the feedback signal generator via the feedback communications channel, generate the adaptive parameter selection signal based on the copy of the feedback, and transmit the adaptive parameter selection signal to the encoding device.

The present disclosure generally further describes some computer-readable storage media for adapting an error correction coding scheme. The computer-readable storage media may have computer-executable instructions stored thereon which, when executed by a computer, cause the computer to perform one or more operations. Some example computer-executable instructions may cause the computer to generate, at the transmitter, a portion of a codeword by encoding the message based on the error correction coding scheme and transmit, at a set power level, a copy of the portion of the codeword from the transmitter to a receiver via a feedforward communications channel. Example computer-executable instructions may further cause the computer to receive, at the receiver, the copy of the portion of the codeword from the transmitter, generate, at the receiver, feedback based on the copy of the portion of the codeword, and transmit a copy of the feedback from the receiver to the transmitter via a feedback communications channel. In addition, example computer-executable instructions may cause the computer to receive, at the transmitter, the copy of the feedback from the receiver, identify, at the transmitter, an error in the copy of the feedback compared to the codeword, and generate, at the transmitter, an adapted error correction coding scheme by adjusting the error correction coding scheme based on the copy of the feedback. Example computer-executable instructions may cause the computer to generate, at the transmitter, an additional portion of the codeword by encoding a subsequent portion of the message based on the adapted error correction coding scheme and transmit, at the set power level, a copy of the additional portion of the codeword from the transmitter to the receiver via the feedforward communications channel.

The present disclosure generally describes techniques for adapting an error correction coding scheme. Some example methods may include receiving a message. Example methods may also include generating a portion of a codeword by encoding the message based on the error correction coding scheme and transmitting a copy of the portion of the codeword from a transmitter to a receiver via a feedforward communications channel. Example methods may further include generating feedback based on the copy of the portion of the codeword and transmitting a copy of the feedback from the receiver to the transmitter via a feedback communications channel. In addition, example methods may include generating an adapted error correction coding scheme by adjusting the error correction coding scheme based on the copy of the feedback.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIGS. 9A-9B are schematic diagrams illustrating computer program products that include a computer program for executing a computer process on a computing device;

Figure 1:
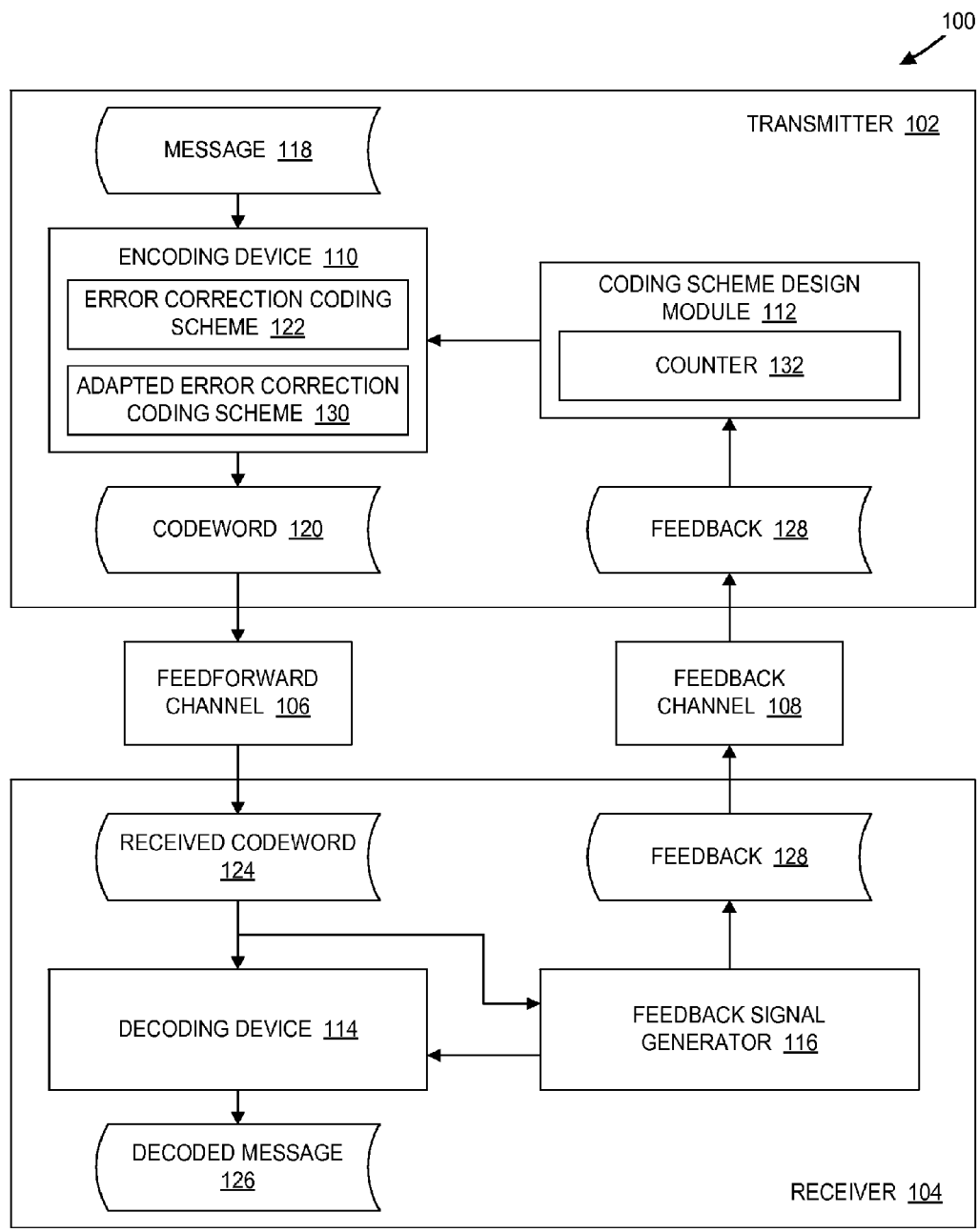
FIG. 1 is a functional block diagram illustrating an example communications architecture adapted to implement an adaptive error correction coding scheme.

all arranged according to at least some embodiments presented.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to various adaptive error correction coding schemes that modify signal transmission from a transmitter to a receiver based on feedback received by the receiver. Such adaptive error correction coding schemes may be designed to operate at high power efficiency (i.e., low power), low complexity, and/or low error probability. As a result, these adaptive coding schemes may be suitable for ubiquitous computing systems, satellite communications, mobile communications, and other suitable technologies that operate under low power, low complexity, and/or low error probability constraints.

In traditional error correcting coding schemes, a transmitter may utilize a fixed error correction coding scheme to encode a message that is then transmitted to a receiver. In contrast to traditional error correction coding schemes, adaptive error correction coding schemes may dynamically adapt an existing error correction coding scheme based on receiver feedback. Under such adaptive error correction coding techniques, a transmitter may be configured to generate an encoded message by encoding a portion of a message using an error correction coding scheme and transmit the encoded message portion to a receiver. The receiver may then be configured to receive the transmitted encoded message portion and provide feedback to the transmitter about the transmitted encoded message portion, which may suffer degradation when during transmission by a low power transmitter. The receiver may also be configured to generate a decoded message portion by decoding the transmitted encoded message portion.

The transmitter may be configured to analyze the feedback in order to determine whether the transmitted encoded message contains an error that might cause the receiver to arrive at an incorrect result when the receiver decodes the transmitted encoded message. If the transmitter determines, based on the feedback, that the transmitted encoded message contains such an error, then the transmitter may be configured to generate an adapted error correction coding scheme by adjusting the error correction coding scheme in order to compensate for the error. The transmitter may be configured to continuously modify the adapted error correction coding scheme based on additional feedback. As the receiver receives additional transmitted message portions that are encoded using the adapted error correction coding scheme, the additional transmitted message portions may be encoded in such a way that the receiver is more likely to arrive at the correct result when decoding the additional transmitted message portions.

Turning now to FIG. 1, a functional block diagram illustrates an example communications architecture 100 adapted to implement an adaptive error correction coding scheme, in accordance with at least some embodiments presented herein. The communications architecture 100 may include a transmitter 102 and a receiver 104 coupled via a feedforward channel 106 and a feedback channel 108. The transmitter 102 may include an encoding device 110 and a coding scheme design module 112. The receiver 104 may include a decoding device 114 and a feedback signal generator 116.

In some embodiments, the transmitter 102 may be a low power transmitter operating under a power constraint. For example, the transmitter 102 may be a radio frequency identification ("RFID") tag, a sensor node, a mobile device, or other suitable device that operates with a limited power supply, such as a battery. In some embodiments, the receiver 104 may be a high power transmitter operating without a power constraint. For example, the receiver 104 may be a RFID reader, data collection center, or other suitable device that is coupled to a constant power source, such as a powerline. The feedforward channel 106 and/or the feedback channel 108 may be implemented on radio frequency ("RF"), infrared light, laser light, visible light, acoustic energy, or other suitable wireless communication technologies. The feedforward channel 106 and/or the feedback channel 108 may implement an appropriate modulation scheme. In some embodiments, the encoding device 110 may be a polar encoder configured to encode messages as polar codes using a polar coding scheme, and the decoding device 114 may be a polar decoder configured to decode the polar codes. In some other embodiments, the encoding device 110 and the decoding device 114 may implement Hamming codes and other low-complexity error correction coding schemes.

The encoding device 110 may be configured to receive messages, such as a message 118. The encoding device 110 may then be configured to generate a codeword 120 by encoding the message 118 according to an error correction coding scheme 122. Upon generating the codeword 120, the encoding device 110 may be configured to transmit the codeword 120 to the receiver 104 via the feedforward channel 106. In particular, the encoding device 110 may be configured to transmit the codeword 120 to the decoding device 114 and the feedback signal generator 116. If the transmitter 102 is a low power transmitter according to some embodiments, then the feedforward channel 106 may degrade the codeword 120 during transmission because the transmitter 102 does not provide sufficient transmission power. For example, the feedforward channel 106 may be a noisy channel. As a result, the decoding device 114 and the feedback signal generator 116 may be configured to receive the codeword 120 as a received codeword 124, where the received codeword 124 may be a degraded copy of the codeword 120 (e.g., the received codeword 124 may contain noise). Upon receiving the received codeword 124, the decoding device 114 may be configured to generate a decoded message 126 by decoding the received codeword 124.

The encoding device 110 may be configured to generate portions of the codeword 120 in a sequential order and transmit the portions of the codeword 120 to the receiver 104 until the codeword 120 is completely transmitted. The feedback signal generator 116 may be configured to receive these portions of the codeword 120 as portions of the received codeword 124. The feedback signal generator 116 may be configured to generate feedback 128 based on at least a portion of the received codeword 124. In this way, the feedback signal generator 116 may be able to correct errors in the error correction coding scheme 122 before the codeword 120 is completely transmitted. The feedback signal generator 116 may be configured to transmit the feedback 128 to the transmitter 102. In particular, the feedback signal generator 116 may be configured to transmit the feedback 128 to the coding scheme design module 112. If the receiver 104 is a high power receiver according to some embodiments, then the feedback channel 108 may not or may not significantly degrade the feedback 128 as it is transmitted over the feedback channel 108 because the receiver 104 provides adequate transmission power. For example, in some instances, the feedback channel 108 may still weakly degrade the feedback 128. However, the degradation may not be significant enough to be detrimental.

In some embodiments, the feedback 128 may be a feedback signal adapted to notify the coding scheme design module 112 as to whether the received codeword 124 contains an error that might cause the decoding device 114 to arrive at an incorrect result when decoding the received codeword 124. When the communications architecture 100 is properly operational, the received codeword 124 should be the same or substantially the same as the codeword 120 such that the decoded message 126 (decoded from the received codeword 124) matches the message 118 (from which the codeword 120 is generated). However, in some cases, the codeword 120 may be different from the received codeword 124 to such an extent that the decoded message 126 does not match the message 118. As previously described, the feedforward channel 106 may degrade the codeword 120 during transmission, according to some embodiments.

When the coding scheme design module 112 receives the feedback 128, the coding scheme design module 112 may be configured to determine whether the feedback 128 indicates that the received codeword 124 contains an error that might cause the decoding device 114 to arrive at an incorrect result when decoding the received codeword 124. In some embodiments, the feedback 128 may include at least a portion of the received codeword 124. In such cases, the coding scheme design module 112 may be configured to determine whether the feedback 128 is different from the corresponding portion of the codeword 120 to such an extent that the decoded message 126 might not match the message 118. If the feedback 128 matches the corresponding portion of the codeword 120, then the coding scheme design module 112 may be configured to not adjust the error correction coding scheme 122. If the feedback 128 does not match the corresponding portion of the codeword 120 but errors in the feedback 128 are not likely to cause an incorrect decoding result, then the coding scheme design module 112 may be configured to not adjust the error correction coding scheme 122. If the feedback 128 does not match the corresponding portion of the codeword 120 and errors in the feedback 128 are likely to cause an incorrect decoding result, then the coding scheme design module 112 may be configured to adjust the error correction coding scheme 122, thereby generating an adapted error correction coding scheme 130 based on the error correction coding scheme 122.

When the coding scheme design module 112 generates the adapted error correction coding scheme 130, the encoding device 110 may be configured to generate additional portions of the codeword 120 using the adapted error correction coding scheme 130 instead of the error correction coding scheme 122. The adapted error correction coding scheme 130 may be configured to account for or attempt to account for the degradation caused by the feedforward channel 106 during transmission. As previously described, upon generating the additional portions of the codeword 120, the encoding device 110 may be configured to transmit the additional portions of the codeword 120 to the decoding device 114 and the feedback signal generator 116. The decoding device 114 and the feedback signal generator 116 may be configured to receive the additional portions of the codeword 120 as additional portions of the received codeword 124. The feedback signal generator 116 may be configured to continuously adjust the current error correction coding scheme based on the additional portions of the received codeword 124, in the manner described above, until the feedback signal generator 116 has determined that the decoding device 114 is likely to arrive at a correct result when decoding the received codeword 124.

In some embodiments, the coding scheme design module 112 may include a counter 132. The coding scheme design module 112 may be configured to increment the counter 132 each time that the coding scheme design module 112 adjusts the current error correction coding scheme. When the counter 132 reaches a threshold where the coding scheme design module 112 still has not determined the decoding device 114 is likely to arrive at a correct result when decoding the received codeword 124, the encoding device 110 may be configured to increase transmission power when transmitting the codeword 120. In this way, the transmitter 102 may be configured to increase transmission power only after attempting to adjust the current error correction coding scheme. That is, the transmitter 102 may be configured to initially attempt to resolve the degradation in the feedforward channel 106 by adjusting the current error correction coding scheme and transmitting data at a fixed transmission power level. The transmitter 102 may then be configured to increase the transmission power level upon determining that adjusting the current error correction coding scheme is not successful over a threshold number of attempts according to the counter 132.

Figure 2A:
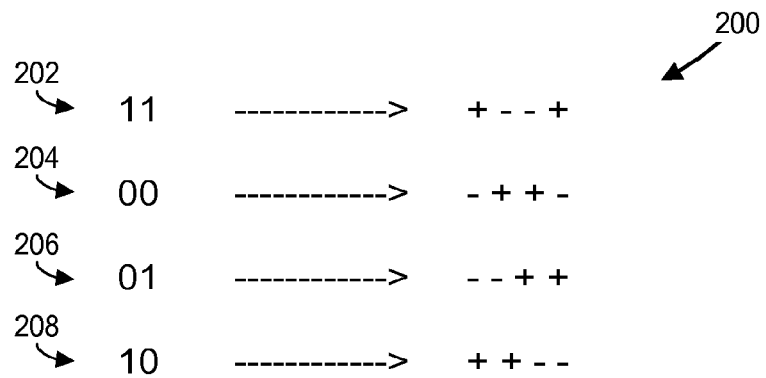
FIG. 2A is a diagram illustrating an example error correction coding rule.

Turning now to FIG. 2A, a diagram illustrates an example error correction coding rule (200), in accordance with at least some embodiments presented herein. In some embodiments, the error correction coding scheme (122) and the adapted error correction coding scheme (130) may be based on the same error correction coding rule, such as the error correction coding rule (200). The error correction coding rule (200) may be configured to map the message (118) to one or more symbols. The error correction coding scheme (122) and the adapted error correction coding scheme (130) may be generated according to the error correction coding rule (200). In particular, as described below with respect to FIGS. 2B and 2C, the error correction coding scheme (122) and the adapted error correction coding scheme (130) may follow the mapping defined by the error correction coding rule (200).

In the example illustrated in FIG. 2A, the message (118) may contain at least two bits of data. For example, the message (118) may be binary 00, binary 01, binary 10, or binary 11. The error correction coding rule (200) may include a first mapping (202), a second mapping (204), a third mapping (206), and a fourth mapping (208). The first mapping (202) may define that binary 11 maps to "+--+", representing a four-symbol data stream including, in order, a positive real number, a negative real number, a negative real number, and a positive real number. The second mapping (204) may define that binary 00 maps to "-++-", representing a four-symbol data stream including, in order, a negative real number, a positive real number, a positive real number, and a negative real number. The third mapping (206) may define that binary 01 maps to "--++", representing a four-symbol data stream including, in order, a negative real number, a negative real number, a positive real number, and a positive real number. The fourth mapping (208) may define that binary 10 maps to "++--", representing a four-symbol data stream including, in order, a positive real number, a positive real number, a negative real number, and a negative real number. A zero value may represent a positive real number or a negative real number according to various implementations.

Figure 2B:
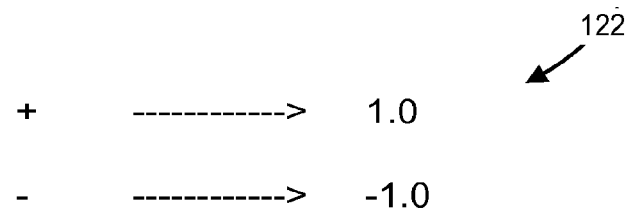
FIG. 2B is a diagram illustrating an example implementation of the error correction coding scheme based on the error correction coding rule.

Turning now to FIG. 2B, a diagram illustrates an example implementation of the error correction coding scheme (122) based on the error correction coding rule (200), in accordance with at least some embodiments presented. According to the example error correction coding rule (200) illustrated in FIG. 2A, the binary values 00, 01, 10, and 11 may be encoded into some combination of symbols including positive real number and negative real numbers prior to transmission over the feedforward channel (106). In some embodiments, the error correction coding scheme (122) may define the symbols such that the positive real number and negative real numbers have a default amplitude.

As illustrated in FIG. 2B, the error correction coding scheme (122) may map each positive real number to 1.0 and each negative real number to an integer –1.0. Thus, in this example, the default amplitude of the positive real number and the negative real number is 1.0. In an illustrative example, the message (118) may include a binary 11. According to the error correction coding scheme (122) in FIG. 2B, the encoding device (110) may be configured to initially encode the message (118) in a "1.0, –1.0, –1.0" data stream (i.e., positive real number, followed by negative real number, followed by negative real number), representing first, second, and third portions of the codeword (120). Each real number in the data stream may represent a separate portion of the codeword (120). The encoding device (110) may then be configured to transmit the portions of the codeword (120) to the decoding device (114) and the feedback signal generator (116) via the feedforward channel (106).

The decoding device (114) and the feedback signal generator (116) may be configured to receive the portions of the codeword (120) as portions of the received codeword (124). Each of the portions of the received codeword (124) may represent a corresponding one of the portions of the codeword (120) after transmission via the feedforward channel (106). In particular, the portions of the received codeword (124) may reflect degradation caused by the feedforward channel (106). In this illustrative example, the decoding device (114) and the feedback signal generator (116) may be configured to receive the three portions of the received codeword (124) as a real number 0.8, a real number 0.1, and a real number –1.6. The real number 0.8 in the first portion of the received codeword (124) may correspond to the real number 1.0 in the first portion of the codeword (120). The real number 0.1 in the second portion of the received codeword (124) may correspond to the real number –1.0 in the second portion of the codeword (120). The real number –1.6 in the third portion of the received codeword (124) may correspond to the real number –1.0 in the third portion of the codeword (120).

As previously described, the binary 11 in the message (118) may be properly encoded as "+--+". The real number 0.8 in the first portion of the received codeword (124) correctly corresponds to the positive real number indicated in the first symbol of the encoding. Further, the real number –1.6 in the third portion of the received codeword (124) correctly corresponds to the negative real number indicated in the third symbol of the encoding. However, the real number 0.1 in the second portion of the received codeword (124) does not correctly correspond to the negative real number indicated in the second symbol of the encoding. As a result, the decoding device (114) may reach an incorrect result, such as a binary 10, when decoding the received codeword (124) corresponding to the message (118).

As the feedback signal generator (116) receives portions of the received codeword (124), the feedback signal generator (116) may be configured to generate the feedback (128) based on one or more of the portions of the received codeword (124) and transmit the feedback (128) to the coding scheme design module (112). In some embodiments, the feedback (128) may represent a quantized version of the corresponding portions of the received codeword (124). In this illustrative example, the feedback signal generator (116) may be configured to quantize the real number 0.8 in the first portion of the received codeword (124) by rounding the real number 0.8 to the nearest integer 1, representing a first feedback portion. The feedback signal generator (116) may be configured to quantize the real number 0.1 in the second portion of the received codeword (124) by rounding the real number 0.1 to the nearest integer 0, representing a second feedback portion. The feedback signal generator (116) may be configured to quantize the real number –1.6 in the third portion of the received codeword (124) by rounding the real number −1.6 to the nearest integer −2, representing a third feedback portion. The feedback (128) may include the first feedback portion, the second feedback portion, and the third feedback portion in a "1, 0, −2" data stream.

The feedback signal generator (116) may be configured to transmit the feedback (128) to the coding scheme design module (112). Upon receiving the feedback (128), the coding scheme design module (112) may be configured to analyze the integer 1 in the first feedback portion and determine that the integer 1 matches the positive sign of the real number 1.0 in the first portion of codeword (120). The coding scheme design module (112) may be configured to analyze the integer −2 in the third feedback portion and determine that the integer −2 matches the negative sign of the real number −1.0 in the third portion of the codeword (120). The coding scheme design module (112) may also be configured to determine that the integer 0 in the second feedback portion does not match the negative sign of the real number −1.0 in the second portion of codeword (120). The coding scheme design module (112) may further be configured to recognize that, in this illustrative example, the feedforward channel (106) reduces the values of the transmitted portions of the codeword (120), thereby causing potentially incorrect portions of the received codeword 124 and potentially resulting in an incorrect decoding result by the decoding device 114.

Figure 2C:
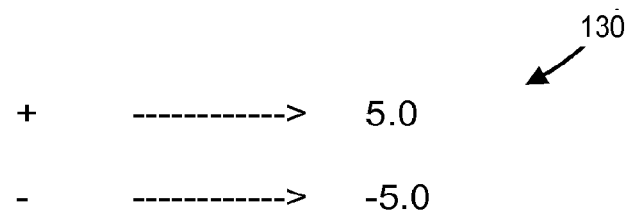
FIG. 2C is a functional block diagram illustrating an example implementation of the adapted error correction coding scheme based on the error correction coding scheme.

Turning now to FIG. 2C, a diagram illustrates an example implementation of the adapted error correction coding scheme (130) based on the error correction coding scheme (122), in accordance with at least some embodiments presented herein. In order to address the reduction in the values of the transmitted portions of the codeword (120) caused by the feedforward channel 106, the coding scheme design module (112) may be configured to generate the adapted error correction coding scheme (130) by adjusting the amplitude of the symbols including the positive real number and the negative real number. When the coding scheme design module (112) recognizes that the feedforward channel (106) reduces the values of the transmitted portions of the codeword (120), the coding scheme design module (112) may be configured to generate an adaptive parameter selection signal and transmit the adaptive parameter selection signal to the encoding device (110). The adaptive parameter selection signal may be configured to instruct the encoding device (110) to increase the default amplitude of the symbols. For example, the adaptive parameter selection signal may be configured to instruct the encoding device (110) to increase the default amplitude of the symbols from the real number 1.0 to a real number 5.0.

Thus, according to the adapted error correction coding scheme (130) in FIG. 2C, the encoding device (110) may be configured to complete encoding the message (118) in a real number 5.0, representing a fourth portion of the codeword (120) following the first three portions of the codeword (120). The encoding device (110) may then be configured to transmit the fourth portion of the codeword (120) to the decoding device (114) and the feedback signal generator (116). The decoding device (114) and the feedback signal generator (116) may be configured to receive the fourth portion of the codeword (120) as a fourth portion of the received codeword (124), thereby completing the transmission of the received codeword (124). In the illustrative example, the decoding device (114) may be configured to receive the fourth portion of the received codeword (124) as a real number 4.3. The real number 4.3 in the fourth portion of the received codeword (124) correctly corresponds to the positive real number indicated in the fourth symbol of the encoding.

In some embodiments, the decoding device (114) may be configured to recognize that the received codeword (124) including a positive real number, a positive real number, a negative real number, and a positive real number likely corresponds to a binary 11. For example, the coding scheme design module 112 may be configured to provide observations regarding the feedback 128 to the decoding device 114. The decoding device 114 may be configured to utilize such observations to determine that the positive real number (i.e., 0.1) in the second portion of the received codeword (124) should be a negative real number. In this way, the decoding device (114) can reach the correct decoding result of the binary 11.

Figure 3:
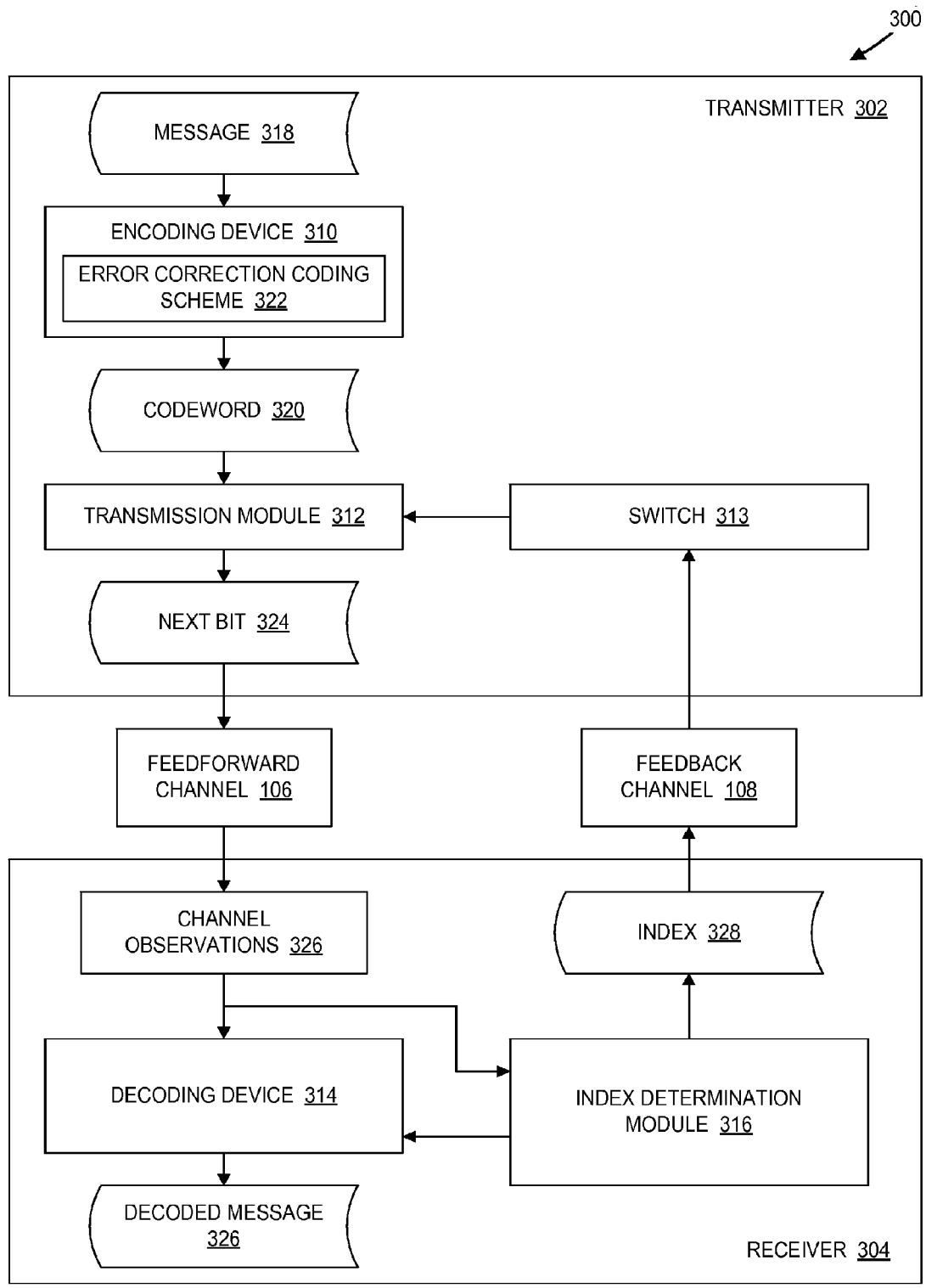
FIG. 3 is a functional block diagram illustrating an example communications architecture adapted to implement an adaptive error correction coding scheme.

Turning now to FIG. 3, a functional block diagram illustrates an example communications architecture 300 adapted to implement an adaptive error correction coding scheme, in accordance with at least some embodiments presented herein. The communications architecture 300 may include a transmitter 302 and a receiver 304 coupled via the feedforward channel 106 and the feedback channel 108. The transmitter 302 may include a message 318, an encoding device 310, a transmission module 312, and a switch 313. The receiver 304 may include a decoding device 314 and an index determination module 316.

The encoding device 310 may be configured to receive messages, such as a message 318. The encoding device 310 may then be configured to generate a codeword 320 by encoding the message 318 according to an error correction coding scheme 322. The error correction coding scheme 322 may be configured to implement polar codes, Hamming codes, or other low-complexity error correction coding scheme. The codeword 320 may include a sequence of multiple bits. The transmission module 312 may be configured to transmit one or more bits from the codeword 320 to the decoding device 314 and the index determination module 316 via the feedforward channel 106. The switch 313 may be configured to instruct the transmission module 312 to transmit certain bits to the decoding device 314 and the index determination module 316. In some embodiments, the transmission module 312 may be configured to modulate the bits prior to transmission.

In some embodiments, the transmitter 302 may be a low power transmitter operating under a power constraint. For example, the transmitter 302 may be a RFID tag, a sensor node, a mobile device, or other suitable device that operates with a limited power supply, such as a battery. In some embodiments, the receiver 304 may be a high power transmitter operating without a power constraint. For example, the receiver 304 may be a RFID reader, data collection center, or other suitable device that is coupled to a constant power source, such as a powerline.

According to various embodiments, the process for transmitting the message 318 may be an interactive process. The index determination module 316 may be configured to determine an index 328 of a next bit 324 (or indices of multiple bits) in the codeword 320 that will be transmitted by the transmission module 312 to the decoding device 314 and the index determination module 316. The index determination module 316 may be configured to receive one or more transmitted bits via the feedforward channel 106 as symbols within channel observations 326. The symbols may represent the transmitted bits after being corrupted by noise in the feedforward channel 106. The index determination module 316 may be configured to determine the index 328 of the next bit 324 (or indices of multiple bits) based on the channel observations 326 by compensating for noise indicated in the channel observations 326.

Upon determining the index 328 of the next bit 324 (or indices of multiple bits) in the codeword 320 that will be transmitted, the index determination module 316 may be configured to transmit the index 328 of the next bit 324 (or indices of multiple bits) to the switch 313 via the feedback channel 108. In some embodiments, the index determination module 316 may be configured to transmit the index 328 (or indices) to the switch 313 at intervals corresponding to pre-determined time slots. Upon receiving the index 328 of the next bit 324 (or indices of multiple bits) in the codeword 320 from the index determination module 316, the switch 313 may be configured to instruct the transmission module 312 to select and transmit the next bit 324 (or multiple bits) in the codeword 320 corresponding to the received index 328 (or indices). For example, the index determination module 316 may instruct the transmission module 312 to transmit the same bit or bits multiple times.

The codeword 320 may be a sequence of bits represented by a variable X. A variable i may represent an index. A variable $X_i$ may represent the i-th bit of the codeword X. The index determination module 316 may be configured to determine the value of the index i. In some embodiments, the index determination module 316 may be configured to determine the value of the index i such that $\Sigma_{i \in M} Z(U_i)$ may be reduced after the transmission module 312 transmits the next bit 324. Here, $Z(U_i)$ may represent the Bhattacharyya parameter of some virtual channels, and $\Sigma_{i \subset M} Z(U_i)$ is an upper bound of error probabilities. Also here, M may represent a set of indexes i; for example, M may be chosen as the indexes of all information-carrying bits in a polar coding scheme.

A generalized message U may be formed during polar encoding. Here, $U_i$ may denote the i-th bit of the generalized message U. Generally, $Z(U_i)$ may denote the Bhattacharyya parameters of a virtual channel from $U_i$ to $U_1, U_2, \ldots U_{i-1}$ and a total channel observation Y. The input of the virtual channel may be the i-th bit of the generalized message U. The outputs of the virtual channel may be the first i−1 bits of the generalized message U and the channel observations.

The generalized message U may be a string of bits, where its coordinates may be partitioned into two parts. For all the index i in a pre-designed set M, the bit $U_i$ at the i-th coordinate of the generalized message U may be determined by the message 318. For example, the bit $U_i$ may equal to one certain bit of the transmitted message 318. While for all index i not in M, the bit $U_i$ at the i-th coordinate may take a pre-designed fixed value. The generalized message U may be encoded into a polar codeword using the polar encoding scheme. Some example polar coding schemes are described in Erdal Arikan, "Channel polarization: a method for constructing capacity-achieving codes for symmetric binary-input memoryless channel", *IEEE Transactions on Information Theory*, July 2009, also available from http://arxiv.org/abs/0807.3917. It should be appreciated that other polar coding schemes may also be utilized.

In some embodiments, the index determination module 316 may be configured to initially set the Bhattacharyya parameters $Z(X_i)$ to 1 for all i. Here, $Z(X_i)$ may denote the Bhattacharyya parameter between the i-th bit of the codeword 320 $X_i$ and the corresponding channel observations $Y_i$. After the index determination module 316 receives a channel output (e.g., the next bit 324) for some $X_i$ from the feedforward channel 106, the index determination module 316 may be configured to identify the channel observations 326 regarding the feedforward channel 106 based on the channel output. For example, the channel observations 326 may include observations of the received signal at the feedforward channel 106. The index determination module 316 may then be configured to recompute the corresponding Bhattacharyya parameter $Z(X_i)$ according to the channel observations and also recompute the Bhattacharyya parameters $Z(U_i)$ for all i.

The index determination module 316 may be configured to compute the next transmitted index i by the following equation:

$$\frac{\partial \left[ \sum_{n \in M} Z(U_n) \right]}{\partial [Z(X_j)]}.$$

The index determination module 316 may be configured to compute a next transmitted bit index i by the following equation, which is an analog of a deepest descent approach in nonlinear optimization:

$$\frac{\partial \left[ \sum_{n \in m} Z(U_n) \right]}{\partial [Z(X_i)]} = \max_j \left\{ \frac{\partial \left[ \sum_{n \in m} Z(U_n) \right]}{\partial [Z(X_j)]} \right\}.$$

That is, the summation $\Sigma_{n \in m} Z(U_n)$ is an upper bound of the error probability. The variable j may refer to a free variable of bit index. The derivative of the upper bound with respect to one of the Bhattacharyya parameters $Z(X_j)$ is $$\left\{ \frac{\partial \left[ \sum_{n \in m} Z(U_n) \right]}{\partial [Z(X_j)]} \right\}.$$

Among the N such derivatives, there may exist one or several integers j, which achieve the largest values of derivatives. The next transmitted index i may be chosen to be one of the above integers j.

In some embodiments, the index determination module 316 may repeat the above message transmission process for a fixed number of time slots according to a fixed power budget. In some other embodiments, the index determination module 316 may be configured to repeat the above process until a certain threshold for the Bhattacharyya upper bound $\Sigma_{n \in m} Z(U_n)$ has been reached.

Various implementations of calculating the Bhattacharyya parameter may be utilized. An i-th bit of a polar codeword may be denoted by $X_i$. Further, $(y_1, y_2, \ldots, y_K)$ may denote received signals corresponding to $X_i$ over K time slots. That is, the i-th bit may be selected for transmission in the interactive coding process during K time slots, and $(y_1, y_2, \ldots, y_K)$ are the received signals during these K time slots. The mapping from $X_i$ to $y_1, y_2, \ldots, y_K$ may be considered as a communication channel from $X_i$ to a super symbol $(y_1, y_2, \ldots, y_K)$.

In a first example approach, the Bhattacharyya parameters $Z(X_i)$ can be defined and used in error probability bounding as defined in the following equation:

$$Z(X_i) = \prod_{k=1}^{K} \sum_{Y_k \in \{y_k, -y_k\}} \sqrt{P(Y_k \mid X_i = 0) P(Y_k \mid X_i = 1)}$$

In this first example approach, the communication channel from $X_i$ to $(y_1, y_2, \ldots, y_K)$ may be considered as a compound channel. A compound channel may refer to a communication channel that is associated with a set of communication channels with the same input alphabet. When a signal is input, the compound channel may be configured to randomly select one channel from a set of channels and transmit the signal using the selected channel. In this example, the selected channel may have a binary input and an output alphabet including symbols ($\pm y_1, \pm y_2, \ldots, \pm y_K$).

In a second example approach, the Bhattacharyya parameters $Z(X_i)$ can be defined and used in error probability bounding as defined in the following equation:

$$Z(X_i) = \alpha \sqrt{\prod_{k=1}^{K} [P(y_k \mid X_i = 0) P(y_k \mid X_i = 1)]} + \alpha \sqrt{\prod_{k=1}^{K} [P(-y_k \mid X_i = 0) P(-y_k \mid X_i = 1)]}$$

where $\alpha$ is a normalization constant resulting from certain probability arguments.

In this second example approach, a different compound channel model may be utilized. Each selected communication channel by the compound channel may have a binary input and a binary output alphabet. The output alphabet may include two super symbols ($y_1, y_2, \ldots, y_K$) and ($-y_1, -y_2, \ldots, -y_K$). This second example approach may result in a lower error probability compared to the first example approach. It should be appreciated that the approaches described herein are merely examples, and other approaches for calculating the Bhattacharyya parameters using other compound channel models and different associate sets of channels may also be utilized.

In some other embodiments, the encoding device 310 and the decoding device 314 may be configured to implement non-binary error correction and detection coding schemes, such as a non-binary polar coding scheme. For example, in such implementations, the next bit 324 may instead correspond to a non-binary symbol, and the index 328 may be an index of non-binary symbols.

Figure 4:
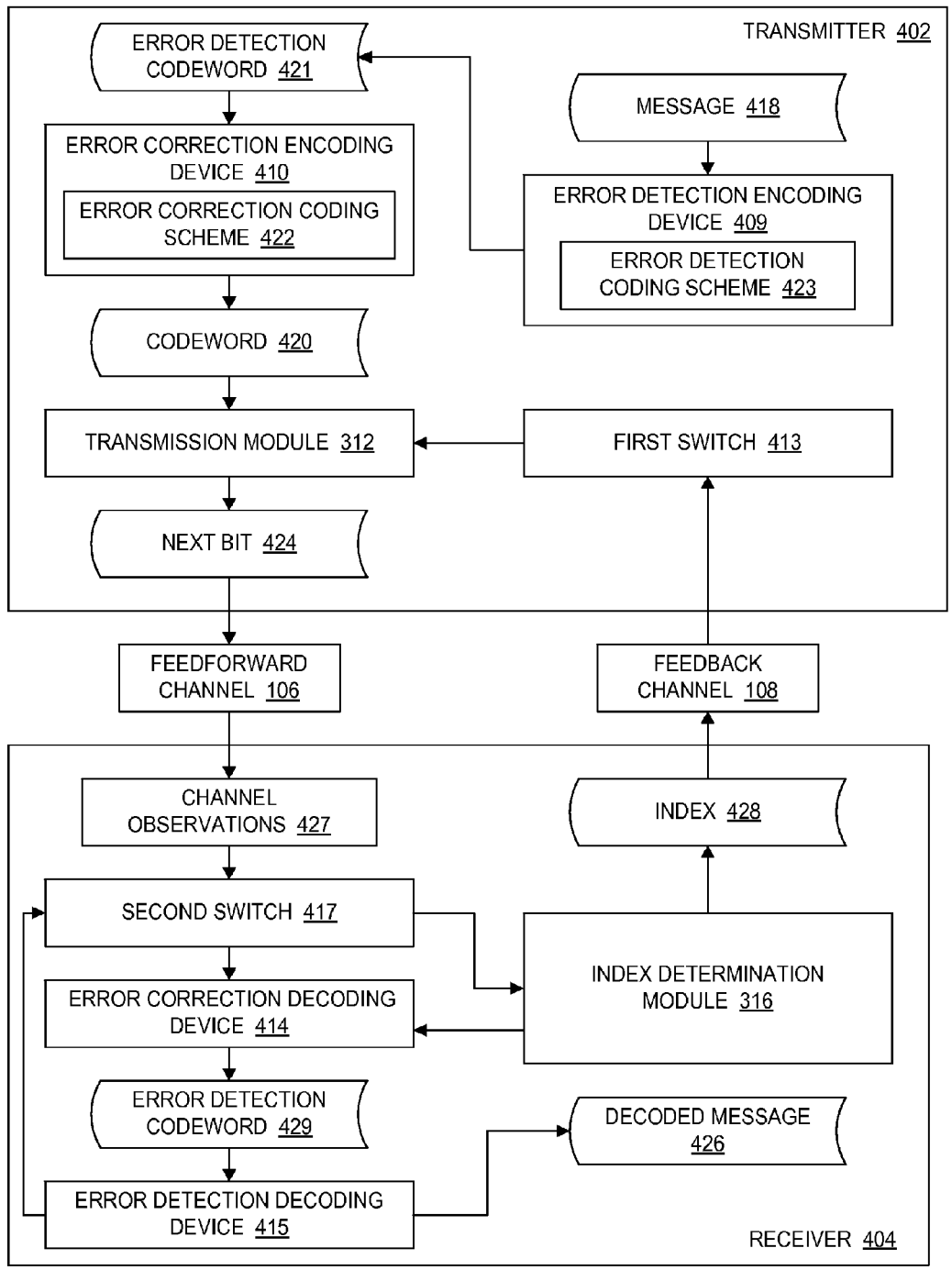
FIG. 4 is a functional block diagram illustrating an example communications architecture adapted to implement an adaptive error correction coding scheme.

Turning now to FIG. 4, a functional block diagram illustrates an example communications architecture 400 adapted to implement an adaptive error correction coding scheme, in accordance with at least some embodiments presented herein. The communications architecture 400 may include a transmitter 402 and a receiver 404 coupled via the feedforward channel 106 and the feedback channel 108. The transmitter 402 may include an error detection encoding device 409, an error correction encoding device 410, a transmission module 312, and a first switch 413. The receiver 404 may include an error correction decoding device 414, an error detection decoding device 415, the index determination module 316, and a second switch 417.

The error detection encoding device 409 may be configured to receive messages, such as a message 418. The error detection encoding device 409 may then be configured to generate an error detection codeword 421 by encoding the message 418 according to an error detection coding scheme 423. In some embodiments, the error detection coding scheme 423 may be a parity check code or other error detection code. In such cases, the error detection encoding device 409 may be configured to divide the message 418 into multiple portions (e.g. sub-strings). The error detection encoding device 409 may then be configured to generate a parity check bit for each of these sub-strings. The error detection codeword 421 may include the sub-strings and their corresponding parity check bits.

Upon generating the error detection codeword 421, the error detection encoding device 409 may be configured to provide the error detection codeword 421 to the error correction encoding device 410. The error correction encoding device 410 may then be configured to generate a codeword 420 by encoding the error detection codeword 421 according to an error correction coding scheme 422. The codeword 420 may include a sequence of multiple bits. The transmission module 312 may be configured to transmit one or more bits from the codeword 420 to the receiver 404. The first switch 413 may be configured to instruct the transmission module 312 to transmit certain symbols to the error detection decoding device 415 and either the error correction decoding device 414 or index determination module 316. The second switch 417 may be configured to establish that either the error correction decoding device 414 or the index determination module 316 receives the bits from the transmission module 312. In some embodiments, the transmission module 312 may be configured to modulate the bits prior to transmission.

In some embodiments, the transmitter 402 may be a low power transmitter operating under a power constraint. For example, the transmitter 402 may be a RFID tag, a sensor node, a mobile device, or other suitable device that operates with a limited power supply, such as a battery. In some embodiments, the receiver 404 may be a high power transmitter operating without a power constraint. For example, the receiver 404 may be a RFID reader, data collection center, or other suitable device that is coupled to a constant power source, such as a powerline.

According to various embodiments, the process for transmitting the message 418 may be an interactive process. The index determination module 316 may be configured to determine an index 428 of a next bit 424 (or indices of multiple bits) in the codeword 420 that will be transmitted by the transmission module 312 to the receiver 404. The index determination module 316 may be configured to receive one or more transmitted bits via the feedforward channel 106 as symbols within channel observations 427. The symbols may represent the transmitted bits after being corrupted by noise in the feedforward channel 106. The index determination module 316 may be configured to determine the index 428 of the next bit 424 (or indices of multiple bits) based on the channel observations 427 by compensating for noise indicated in the channel observations 427. For example, the index determination module 316 may instruct the transmission module 312 to transmit the same bit or bits multiple times.

Upon determining the index 428 of the next bit 424 (or indices of multiple bits) in the codeword 420 that will be transmitted, the index determination module 316 may be configured to transmit the index 428 of the next bit 424 (or indices of multiple bits) to the first switch 413 via the feedback channel 108. In some embodiments, the index determination module 316 may be configured to transmit the index 428 (or indices) to the first switch 413 at intervals corresponding to predetermined time slots. Upon receiving the index 428 of the next bit 424 (or indices of multiple bits) in the codeword 420 from the index determination module 316, the first switch 413 may be configured to instruct the transmission module 312 to select and transmit the next bit 424 (or multiple bits) in the codeword corresponding to the received index 428 (or indices). Some example implementations of the index determination module 316 are described above with reference to FIG. 3.

The transmitter 402 may be configured to continue sending bits to the receiver 404 for multiple time slots until the receiver 404 decides that the error correction decoding device 414 can reliably decode the received bits. In some embodiments, the second switch 417 may initially be configured to establish that the error correction decoding device 414 receives the bits from the transmission module 312. That is, when the index determination module 316 receives the bits from the transmission module 312, the error correction decoding device 414 and the error detection decoding device 415 may not receive the bits. After the second switch 417 receives a threshold number of indexes from the index determination module 316, the second switch 417 may be configured to establish that the error correction decoding device 414, instead of the index determination module 316, receives the bits from the transmission module 312. The second switch 417 may also be configured to notify the transmission module 312 that the transmission process is complete such that the transmission module 312 can stop transmitting additional bits. The error correction decoding device 414 may be configured to generate an error detection codeword 429 by decoding the received bits. The error detection codeword 429 may include the error detection code included in the error detection codeword 421.

The error detection decoding device 415 may be configured to analyze the error detection code in the error detection codeword 429 in order to determine whether the error detection codeword 429 contains an error. If the error detection decoding device 415 determines that the error detection codeword 429 does not contain an error, then the error detection decoding device 415 may be configured to generate a decoded message 426 by decoding the error detection codeword 429. If the error detection decoding device 415 determines that the error detection codeword 429 contains an error, then the error detection decoding device 415 may be configured to instruct the second switch 417 to establish that the index determination module 316 receives the bits from the transmission module 312. The second switch 417 may also be configured to notify the transmission module 312 to restart the transmission process. The transmitter 402 may be configured to continue sending bits, as previously described, to the receiver 404 for multiple time slots until the receiver 404 again decides that the error correction decoding device 414 can reliably decode the received bits. The above transmission process may be repeated until the error detection decoding device 415 outputs the decoded message 426.

In some other embodiments, the error correction encoding device 410 and the error detection encoding device 409 may be configured to implement non-binary error correction and detection coding schemes, such as a non-binary polar coding scheme. For example, in such implementations, the next bit 424 may instead correspond to a non-binary symbol, and the index 428 may be an index of non-binary symbols.

Figure 5:
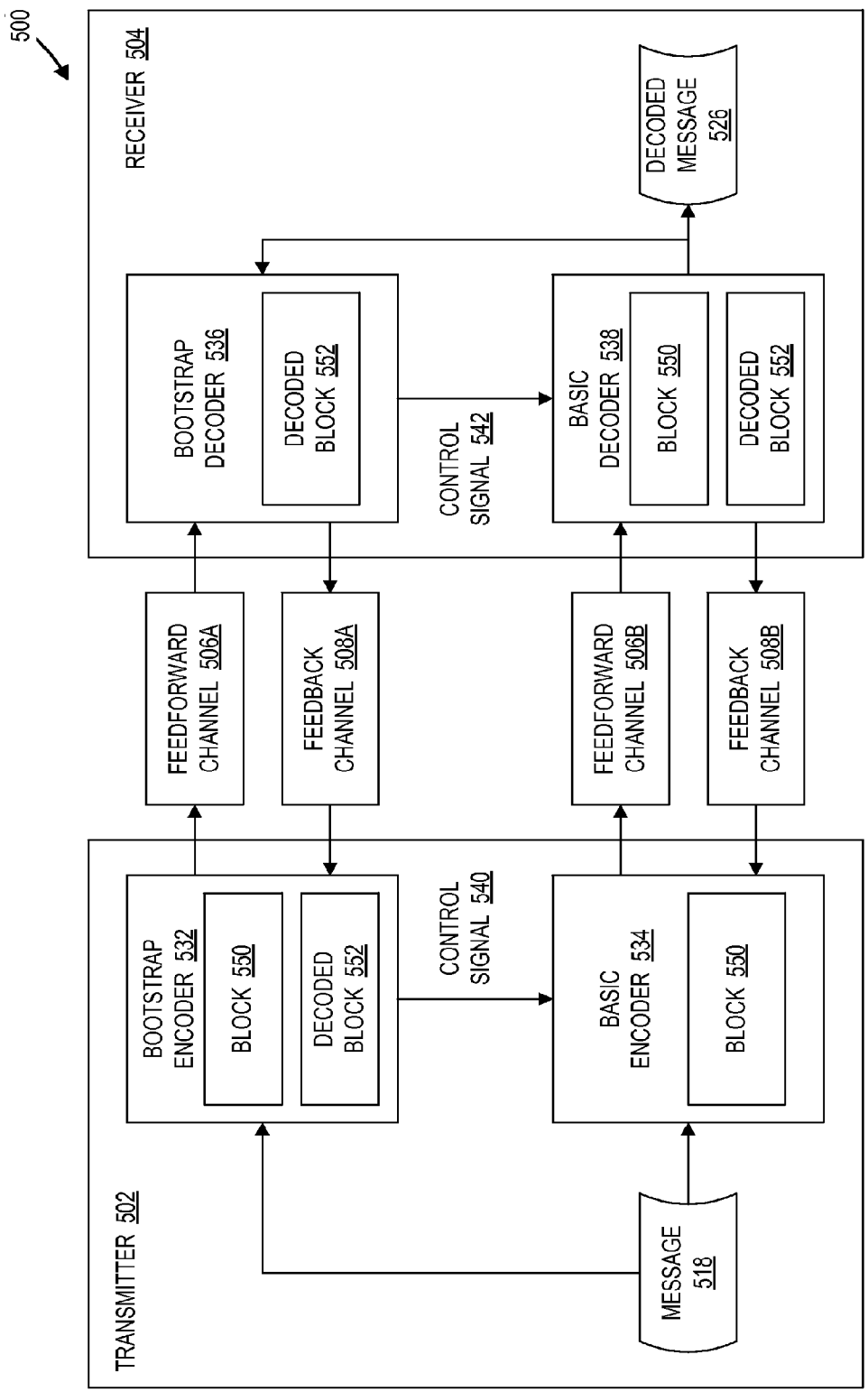
FIG. 5 is a functional block diagram illustrating an example communications architecture adapted to implement an adaptive error correction coding scheme.

Turning now to FIG. 5, a functional block diagram illustrates an example communications architecture 500 adapted to implement an adaptive error correction coding scheme, in accordance with at least some embodiments presented herein. The communications architecture 500 may include a transmitter 502 and a receiver 504 coupled via feedforward channels 506A, 506B and feedback channels 508A, 508B. The transmitter 502 may include a bootstrap encoder 532 and a basic encoder 534. The receiver 504 may include a bootstrap decoder 536 and a basic decoder 538.

The bootstrap encoder 532 and the bootstrap decoder 536 may be configured to communicate via the feedforward channel 506A and the feedback channel 508A. The basic encoder 534 and the basic decoder 538 may be configured to communicate via the feedforward channel 506B and the feedback channel 508B. In some embodiments, the feedforward channel 506A and the feedforward channel 506B may be different physical communications channels. In some other embodiments, the feedforward channel 506A and the feedforward channel 506B may be a single physical communications channel operating under different time slots. In some embodiments, the feedback channel 508A and the feedback channel 508B may be different physical communications channels. In some other embodiments, the feedback channel 508A and the feedback channel 508B may be a single physical communications channel operating under different time slots.

In some embodiments, the basic encoder 534 and the basic decoder 538 may be configured to implement a bit-level or symbol-level feedback scheme. Some examples of bit-level or symbol level feedback schemes are described above with reference to FIGS. 3 and 4. In some embodiments, the bootstrap encoder 532 and the bootstrap decoder 536 may be configured to implement an additional feedback scheme that can be combined with the bit-level or symbol-level feedback scheme in order to further reduce error probabilities when decoding transmitted messages. An example of such an additional feedback scheme is the Yamamoto-Ito feedback scheme described in H. Yamamoto and K. Itoh, "Asymptotic performance of a modified Schalkwijk-Barron scheme for channels with noiseless feedback," *IEEE Trans. Inform. Theory*, vol. IT-25, pp. 729 733, November 1979.

The basic encoder 534 may be configured to receive a message 518 and to encode the message 518 into multiple blocks, such as a block 550. For example, each of the blocks may include a fixed number of bits. The basic encoder 534 may be configured to transmit at least one block, such as the block 550, to the basic decoder 538 via the feedforward channel 506B. Upon receiving the block 550, the basic decoder 538 may be configured to decode the block 550 into a decoded block 552. The basic decoder 538 may be configured to transmit feedback, such as the channel observations 326 previously described, to the basic encoder 534 via the feedback channel 508B.

The basic decoder 538 may also be configured to provide the decoded block 552 to the bootstrap decoder 536. The bootstrap decoder 536 may be configured to transmit the decoded block 552 to the bootstrap encoder 532 via the feedback channel 508A. The bootstrap encoder 532 may be configured to determine if the decoded block 552 is correct. For example, the bootstrap encoder 532 may be configured to compare the decoded block 552 to the block 550. If the bootstrap encoder 532 determines that the decoded block 552 is correct, then the bootstrap encoder 532 may be configured to transmit a positive acknowledge ("ACK") signal to the bootstrap decoder 536 via the feedforward channel 506A. If the bootstrap encoder 532 determines that the decoded block 552 is not correct, then the bootstrap encoder 532 may be configured to transmit a negative acknowledge ("NACK") signal to the bootstrap decoder 536 via the feedforward channel 506A.

In response to receiving the ACK signal, the bootstrap decoder 536 may be configured to instruct, via a control signal 542, the basic decoder 538 to terminate the transmission process between the basic encoder 534 and the basic decoder 538. The bootstrap decoder 536 may also be configured to instruct, via the control signal 542, the basic decoder 538 to generate a decoded message 526 by decoding the received blocks. The basic decoder 538 may then be configured to generate the decoded message 526, as well as to notify the basic encoder 534 to stop sending further information for the current block. In response to receiving the NACK signal, the bootstrap decoder 536 may be configured to instruct, via the control signal 542, the basic decoder 538 to continue the transmission process between the basic encoder 534 and the basic decoder 538. The basic encoder 534 may then be configured to continue sending additional bits or symbols to the basic decoder 538 until the basic decoder 538 receives the ACK signal from the bootstrap decoder 536. A control signal 540 may notify the basic encoder 534 to stop transmission and move to the next block.

In some other embodiments, the bootstrap encoder 532, the basic encoder 534, the bootstrap decoder 536, and the basic decoder 538 may be configured to implement non-binary error correction and detection coding schemes, such as a non-binary polar coding scheme. For example, in such implementations, the bootstrap encoder 532, the basic encoder 534, the bootstrap decoder 536, and the basic decoder 538 may process non-binary symbols rather than binary bits.

Figure 6:
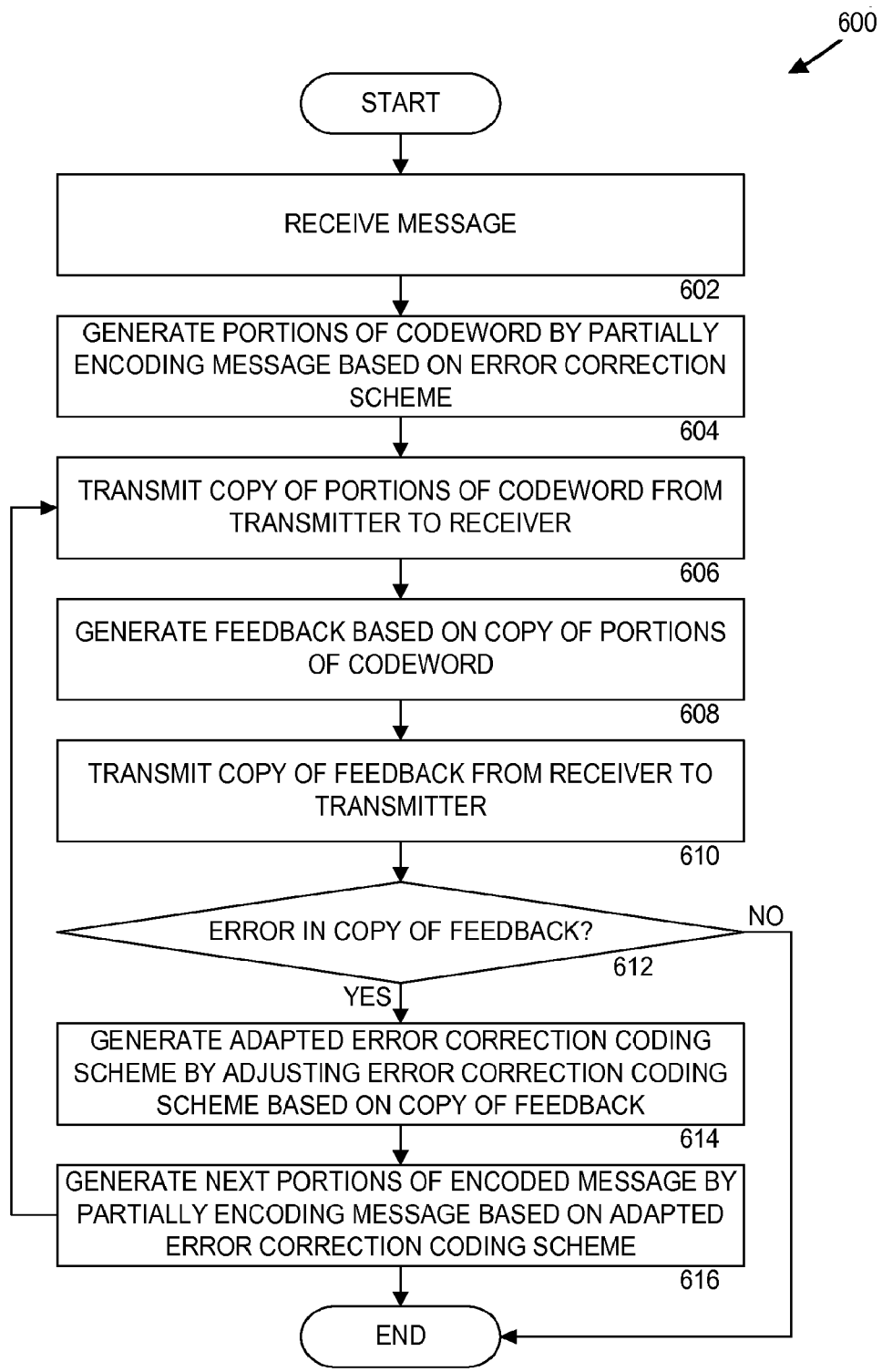
FIG. 6 is a flow diagram illustrating an example process adapted to modify signal transmission from a transmitter to a receiver based on feedback received by the receiver.

Turning now to FIG. 6, a flow diagram illustrates an example process 600 adapted to modify signal transmission from a transmitter to a receiver based on feedback received by the receiver, in accordance with at least some embodiments presented herein. The process 600 may include various operations, functions, or actions as illustrated by one or more of blocks 602 through 616.

The process 600 may begin at block 602 (Receive Message), where an encoding device, such as the encoding device 110, in the transmitter may be configured to receive a message, such as the message 118. The message 118 may include multiple bits. In some embodiments, the message 118 may include a communication that is transmitted from a transmitter to a receiver in a ubiquitous computing system or other suitable technologies that operate under low power, low complexity, and/or low error probability constraints. In such technologies, the transmitter may be a low power transmitter that operates under a power constraint, whereas the receiver may be a high power receiver that does not operate under the power constraint. Block 602 may be followed by block 604.

At block 604 (Generate Portions of Codeword By Partially Encoding Message Based on Error Correction Scheme), the encoding device may be configured to generate a codeword, such as the codeword 120, by encoding the message 118 based on an error correction coding scheme, such as the error correction coding scheme 122. The encoding device may then be configured to transmit the codeword to the receiver. The receiver may be configured to receive a corresponding received codeword, such as the received codeword 124. Some examples of the error correction coding scheme may include polar codes, Hamming codes, or other low-complexity error correction coding scheme. In some embodiments, the encoding device may be configured to generate portions of the codeword in a sequential order. In this way, the encoding device may be configured to transmit portions of the codeword to the receiver before the encoding device has completely encoded the message. Block 604 may be followed by block 606.

At block 606 (Transmit Copy of Portions of Codeword from Transmitter to Receiver), the encoding device may be configured to transmit portions of the codeword to the receiver via a feedforward channel, such as the feedforward channel 106. A feedback signal generator, such as the feedback signal generator 116, in the receiver may be configured to receive a copy of the portions of the codeword. As previously described, the transmitter may be a low power transmitter that operates under a power constraint. In some cases, the feedforward channel may be a noisy channel. The transmitter may not have sufficient power to transmit the portions of the codeword without degradation over a noisy channel. As a result, the copy of the portions of the codeword received by the feedback signal generator may contain one or more errors. Such errors may cause a decoding device, such as the decoding device 114, to arrive at an incorrect decoding result when decoding the received codeword. Block 606 may be followed by block 608.

At block 608 (Generate Feedback Based on Copy of Portions of Codeword), the feedback signal generator may be configured to generate feedback, such as the feedback 128, based on the copy of the portions of the codeword. In some embodiments, the feedback may include at least a portion of the received codeword. Block 608 may be followed by block 610.

At block 610 (Transmit Copy of Feedback to from Receiver to Transmitter), the feedback signal generator may be configured to transmit a copy of the feedback to the transmitter via a feedback channel, such as the feedback channel 108. A coding scheme design module, such as the coding scheme design module 112, in the transmitter may be configured to receive the copy of the feedback. As previously described, the receiver may be a high power receiver that does not operate under the power constraint. For example, the receiver may be coupled to a constant power source, such as a powerline. As such, the receiver may have sufficient transmission power to transmit the copy of the feedback where the feedback channel does not degrade or does not degrade significantly the copy of the feedback received by the coding scheme design module. Block 610 may be followed by block 612.

At block 612 (Determine Whether Copy of Feedback Contains an Error), the coding scheme design module 112 may be configured to determine whether the received copy of the feedback contains an error. As previously described, the feedback may include at least a portion of the received codeword, according to some embodiments. In this case, the coding scheme design module 112 may be configured to determine whether the portion of the received codeword indicates that the decoding device may arrive at an incorrect decoding result when decoding the received codeword. If the coding scheme design module 112 determines that the received codeword does not indicate that the decoding device may arrive at an incorrect decoding result when decoding the received codeword, the process 600 may either repeat (e.g., periodically, continuously, or on demand as needed) or terminate. If the coding scheme design module 112 determines that the received codeword indicates that the decoding device may arrive at an incorrect decoding result when decoding the received codeword, block 612 may be followed by block 614.

At block 614 (Generate Adapted Error Correction Coding Scheme By Adjusting Error Correction Coding Scheme Based on Copy of Feedback), the coding scheme design module may be configured to generate an adapted error correction coding scheme by adjusting the error correction coding scheme based on the copy of the feedback. The adapted error correction coding scheme may be configured to account for the degradation caused by the feedforward channel during transmission. Block 614 may be followed by block 616.

At block 616 (Generate Next Portions of Encoded Message by Partially Encoding Message Based on Adapted Error Correction Coding Scheme), the encoding device may be configured to generate additional portions of the encoded message by partially encoding the message based on the adapted error correction coding scheme. Block 616 may be followed by block 612. Blocks 612-616 may be repeated until the coding scheme design module determines that the received codeword does not indicate that the decoding device may arrive at an incorrect decoding result when decoding the received codeword. The process 600 may either repeat (e.g., periodically, continuously, or on demand as needed) or terminate.

Figure 7:
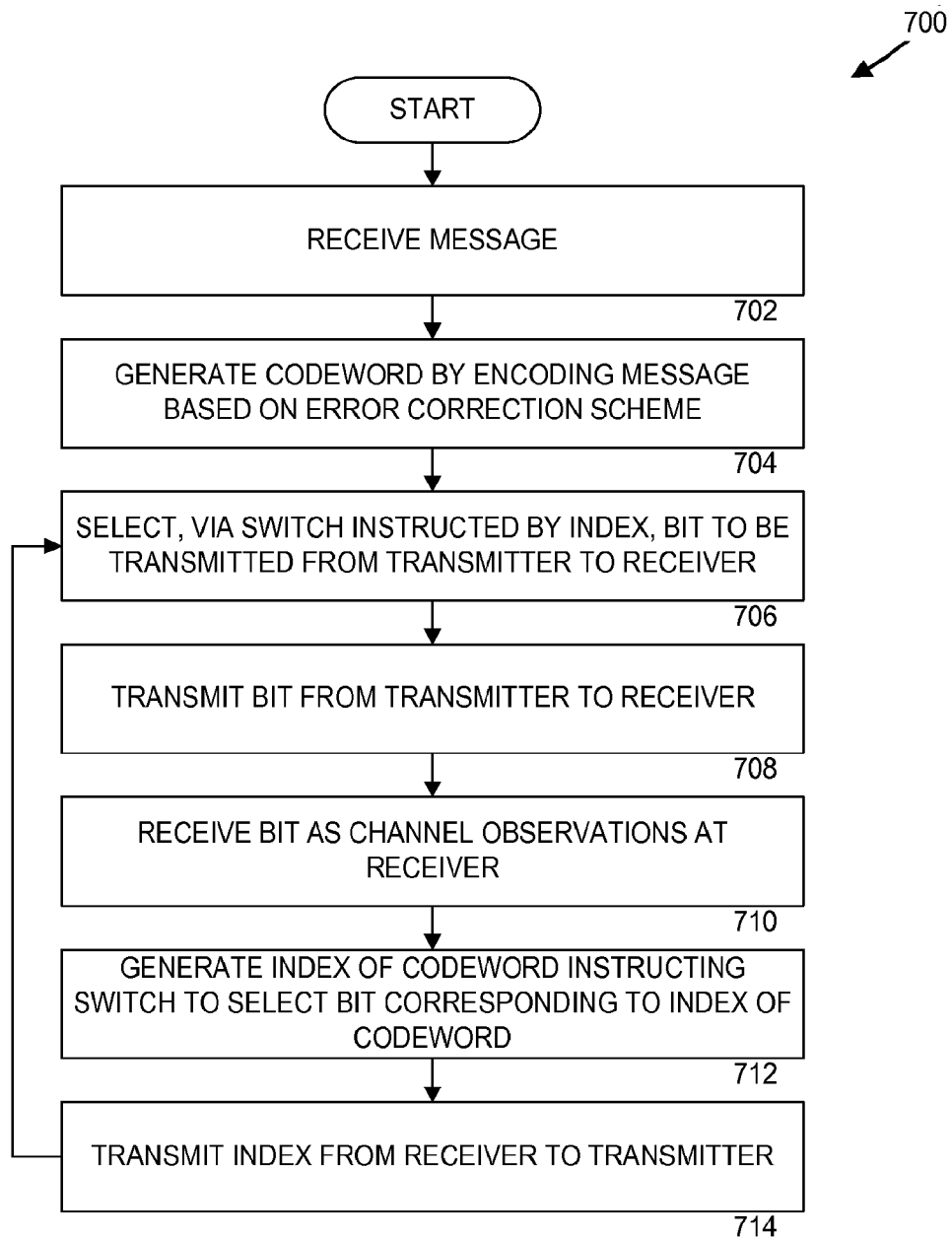
FIG. 7 is a flow diagram illustrating an example process adapted to modify signal transmission from a transmitter to a receiver based on channel observations received by the receiver.

Turning now to FIG. 7, a flow diagram illustrates an example process 700 adapted to modify signal transmission from a transmitter to a receiver based on channel observations received by the receiver, in accordance with at least some embodiments presented herein. The process 700 may include various operations, functions, or actions as illustrated by one or more of blocks 702 through 714.

The process 700 may begin at block 702 (Receive Message), where an encoding device, such as the encoding device 310, in the transmitter may be configured to receive a message, such as the message 318. The message 318 may include multiple bits. In some embodiments, the message 118 may include a communication that is transmitted from a transmitter to a receiver in a ubiquitous computing system or other suitable technologies that operate under low power, low complexity, and/or low error probability constraints. In such technologies, the transmitter may be a low power transmitter that operates under a power constraint, whereas the receiver may be a high power receiver that does not operate under the power constraint. Block 702 may be followed by block 704.

At block 704 (Generate Codeword by Encoding Message Based on Error Correction Scheme), the encoding device may be configured to generate a codeword, such as the codeword 320, by encoding the message 318 based on an error correction coding scheme, such as the error correction coding scheme 322. The encoding device may then be configured to transmit the codeword to the receiver. Some examples of the error correction coding scheme may include polar codes, Hamming codes, or other low-complexity error correction coding scheme. Block 704 may be followed by block 706.

At block 706 (Select, Via Switch Instructed by Index, Bit to be Transmitted from Transmitter to Receiver), a switch, such as the switch 313, may be configured to select a next bit to be transmitted by a transmission module, such as the transmission module 312. The switch may be configured to select the next bit corresponding to an index of the codeword. The switch may receive the index of the codeword from the receiver. Block 706 may be followed by block 708.

At block 708 (Transmit Bit from Transmitter to Receiver), the transmission module may be configured to transmit the bit, which was selected by the switch, from the transmitter to the receiver. The transmission module may be configured to transmit the bit from the transmitter to the receiver via a feedforward channel, such as the feedforward channel 106. Block 708 may be followed by block 710.

At 710 (Receive Bit as Channel Observations at Receiver), an index determination module, such as the index determination module 316, may be configured to receive the transmitted bit from the transmitter as channel observations, such as the channel observations 326. As previously described, the transmitter may be a low power transmitter that operates under a power constraint. In some cases, the feedforward channel may be a noisy channel. The transmitter may not have sufficient power to transmit the bits of the codeword without degradation over a noisy channel. As a result, the transmitted bits of the codeword received by the receiver may contain one or more errors, which may be indicated within the channel observations. Such errors may cause a decoding device, such as the decoding device 314, to arrive at an incorrect decoding result when decoding the received codeword. Block 710 may be followed by block 712.

At block 712 (Generate Index of Codeword Instructing Switch to Select Bit Corresponding to Index of Codeword), the index determination module may be configured to generate an index of the codeword instructing the switch to select the next bit corresponding to the index of the codeword. The index determination module may be configured to analyze the channel observations to identify noise. For example, the channel observations may include symbols representing transmitted bits that have been degraded by the feedforward channel during transmission. Upon identifying noise in the channel observations, the index determination module may be configured to generate the index in order to compensate for the noise. For example, the index determination module may be configured to generating an index of the codeword instructing the switch to select one or more of the same bits. In this way, the transmission module may repeat the transmission of the same bit or bits multiple times. Block 712 may be followed by block 714.

At block 714 (Transmit Index from Receiver to Transmitter), the index determination module may be configured to transmit the index from the receiver to the transmitter. The index determination module may be configured to transmit the index of the switch. Block 714 may be followed by block 706. Blocks 706-714 may be repeated as necessary or desired in order to modify the transmission of bits by the transmission module. The process 700 may either repeat (e.g., periodically, continuously, or on demand as needed) or terminate.

Figure 8:
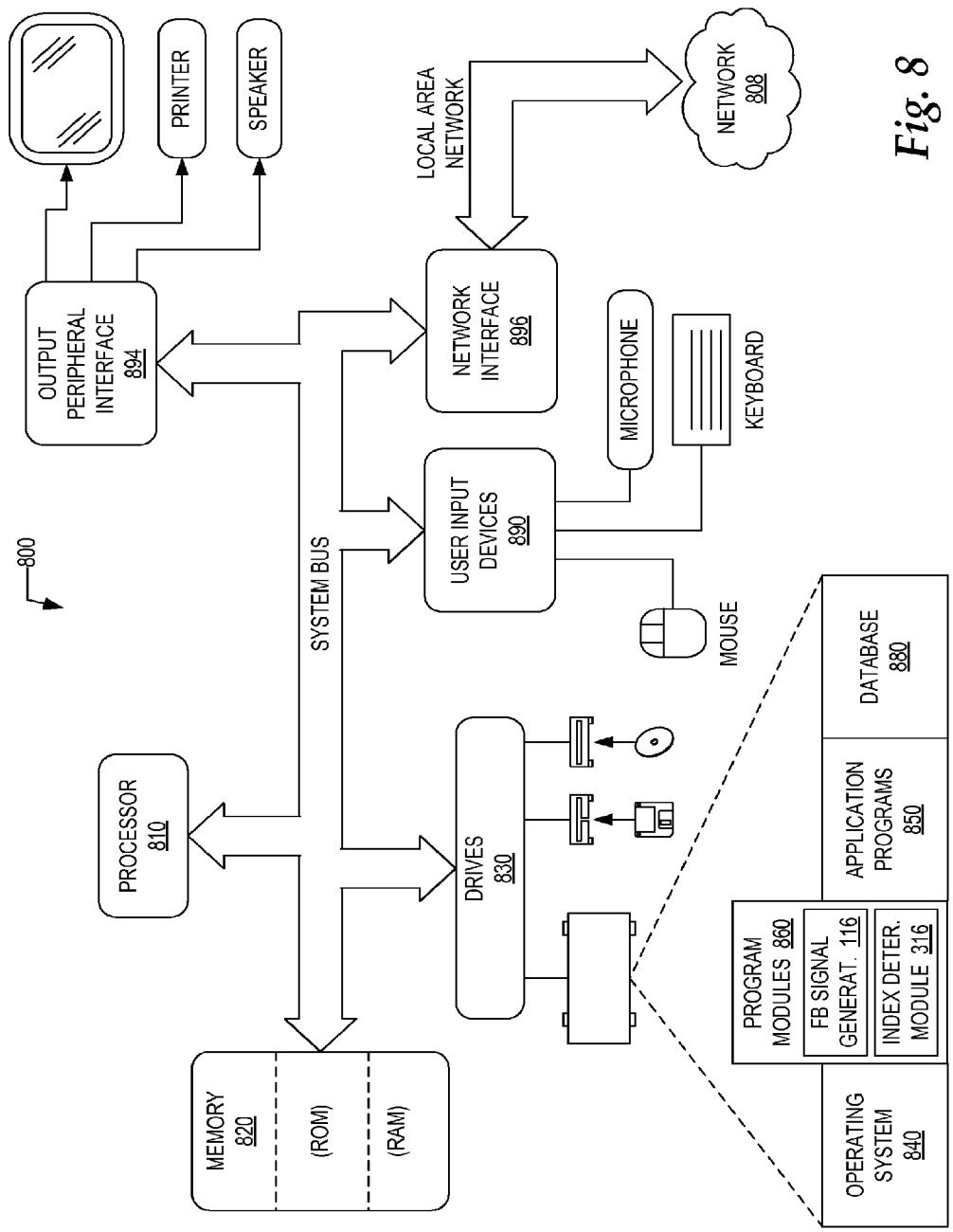
FIG. 8 is a block diagram illustrating a computer hardware architecture for an example computing system.

FIG. 8 is a block diagram illustrating a computer hardware architecture for an example computing system configured in accordance with at least some embodiments presented herein. FIG. 8 includes a computer 800, including a processor 810, memory 820 and one or more drives 830. The computer 800 may be implemented as a conventional computer system, an embedded control computer, a laptop, or a server computer, a mobile device, a set-top box, a kiosk, a vehicular information system, a mobile telephone, a customized machine, or other hardware platform.

The drives 830 and their associated computer storage media, provide storage of computer readable instructions, data structures, program modules and other data for the computer 800. The drives 830 can include an operating system 840, application programs 850, program modules 860, and a database 880. The program modules 860 may include an encoding device (not shown), the feedback signal generator 116, and/or the index determination module 316. The computer 800 may be configured to operate as a transmitter when the computer 800 implements the encoding device. The computer 800 may be configured to operate as a receiver when the computer 800 implements the feedback signal generator 116 and/or the index determination module 316. The encoding device, the feedback signal generator 116, and/or the index determination module 316 may be adapted to execute the process 600 and/or process 700 for modifying signal transmission from a transmitter to a receiver as described in greater detail above (e.g., see previous descriptions with respect to one or more of FIGS. 1-7). The computer 800 further includes user input devices 890 through which a user may enter commands and data. Input devices can include an electronic digitizer, a microphone, a keyboard and pointing device, commonly referred to as a mouse, trackball or touch pad. Other input devices may include a joystick, game pad, satellite dish, scanner, or the like.

These and other input devices can be coupled to the processor 810 through a user input interface that is coupled to a system bus, but may be coupled by other interface and bus structures, such as a parallel port, game port or a universal serial bus ("USB"). Computers such as the computer 800 may also include other peripheral output devices such as speakers, which may be coupled through an output peripheral interface 894 or the like.

The computer 800 may operate in a networked environment using logical connections to one or more computers, such as a remote computer coupled to a network interface 896. The remote computer may be a personal computer, a server, a router, a network PC, a peer device or other common network node, and can include many or all of the elements described above relative to the computer 800. Networking environments are commonplace in offices, enterprise-wide area networks ("WAN"), local area networks ("LAN"), intranets, and the Internet.

When used in a LAN or WLAN networking environment, the computer 800 may be coupled to the LAN through the network interface 896 or an adapter. When used in a WAN networking environment, the computer 800 typically includes a modem or other means for establishing communications over the WAN, such as the Internet or the network 808. The WAN may include the Internet, the illustrated network 808, various other networks, or any combination thereof. It will be appreciated that other mechanisms of establishing a communications link, ring, mesh, bus, cloud, or network between the computers may be used.

According to some embodiments, the computer 800 may be coupled to a networking environment. The computer 800 may include one or more instances of a physical computer-readable storage medium or media associated with the drives 830 or other storage devices. The system bus may enable the processor 810 to read code and/or data to/from the computer-readable storage media. The media may represent an apparatus in the form of storage elements that are implemented using any suitable technology, including but not limited to semiconductors, magnetic materials, optical media, electrical storage, electrochemical storage, or any other such storage technology. The media may represent components associated with memory 820, whether characterized as RAM, ROM, flash, or other types of volatile or nonvolatile memory technology. The media may also represent secondary storage, whether implemented as the storage drives 830 or otherwise. Hard drive implementations may be characterized as solid state, or may include rotating media storing magnetically-encoded information.

The storage media may include one or more program modules 860. The program modules 860 may include software instructions that, when loaded into the processor 810 and executed, transform a general-purpose computing system into a special-purpose computing system. As detailed throughout this description, the program modules 860 may provide various tools or techniques by which the computer 800 may participate within the overall systems or operating environments using the components, logic flows, and/or data structures discussed herein.

The processor 810 may be constructed from any number of transistors or other circuit elements, which may individually or collectively assume any number of states. More specifically, the processor 810 may operate as a state machine or finite-state machine Such a machine may be transformed to a second machine, or specific machine by loading executable instructions contained within the program modules 860. These computer-executable instructions may transform the processor 810 by specifying how the processor 810 transitions between states, thereby transforming the transistors or other circuit elements constituting the processor 810 from a first machine to a second machine. The states of either machine may also be transformed by receiving input from the one or more user input devices 890, the network interface 896, other peripherals, other interfaces, or one or more users or other actors. Either machine may also transform states, or various physical characteristics of various output devices such as printers, speakers, video displays, or otherwise.

Encoding the program modules 860 may also transform the physical structure of the storage media. The specific transformation of physical structure may depend on various factors, in different implementations of this description. Examples of such factors may include, but are not limited to: the technology used to implement the storage media, whether the storage media are characterized as primary or secondary storage, and the like. For example, if the storage media are implemented as semiconductor-based memory, the program modules 860 may transform the physical state of the semiconductor memory 820 when the software is encoded therein. For example, the software may transform the state of transistors, capacitors, or other discrete circuit elements constituting the semiconductor memory 820.

As another example, the storage media may be implemented using magnetic or optical technology such as drives 830. In such implementations, the program modules 860 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. It should be appreciated that various other transformations of physical media are possible without departing from the scope and spirit of the present description.

Figure 9A:
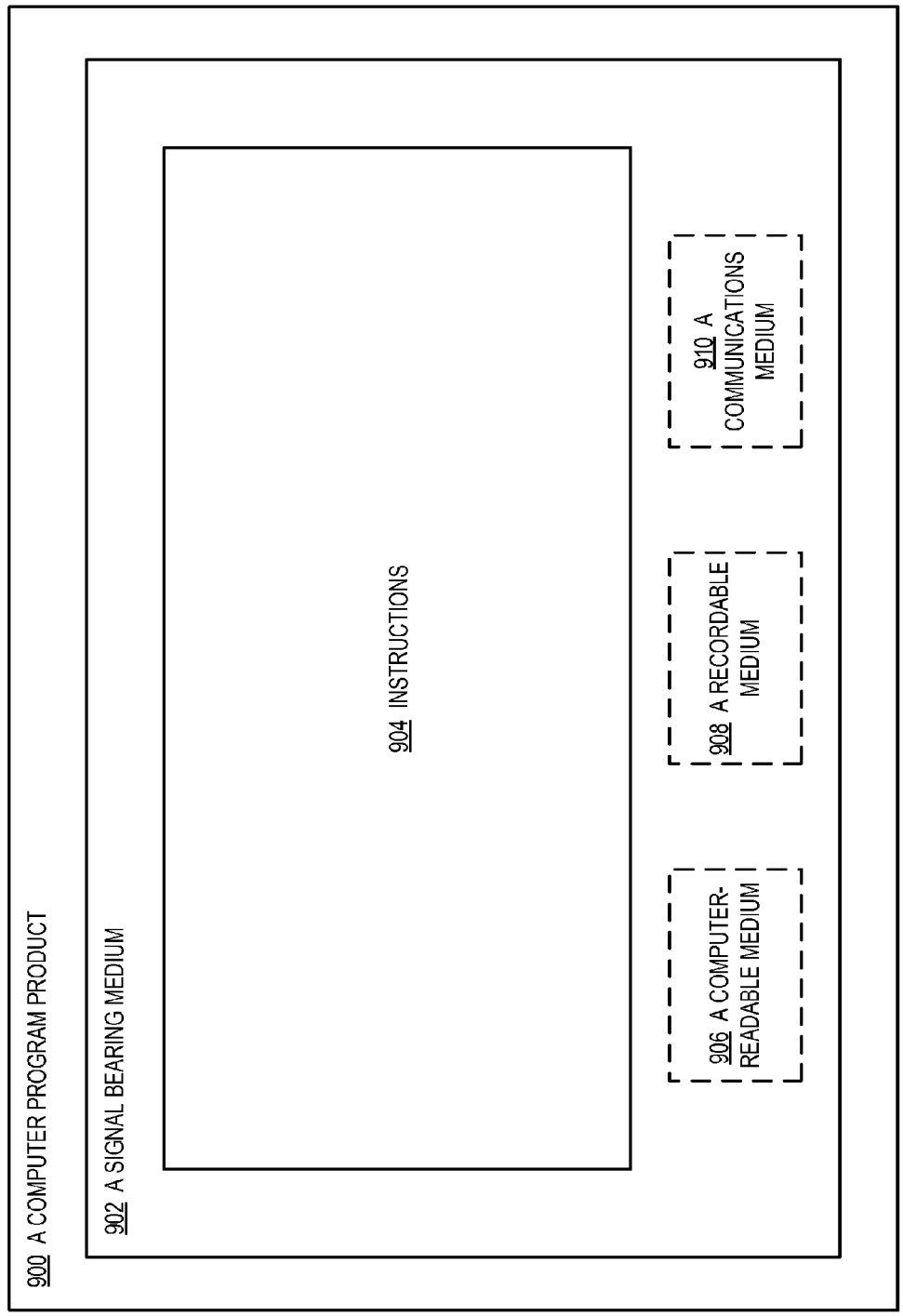

Turning now to FIGS. 9A-9B, schematic diagrams that illustrate a computer program product 900 that includes a computer program for executing a computer process on a computing device, arranged according to at least some embodiments presented herein. An illustrative embodiment of the example computer program product is provided using a signal bearing medium 902, and may include at least one instruction of 904: one or more instructions for receiving a message; one or more instructions for generating a portion of a codeword by encoding the message based on the error correction coding scheme; one or more instructions for transmitting a copy of the portion of the codeword from a transmitter to a receiver via a feedforward communications channel; one or more instructions for generating feedback based on the copy of the portion of the codeword; one or more instructions for transmitting a copy of the feedback from the receiver to the transmitter via a feedback communications channel; or one or more instructions for generating an adapted error correction coding scheme by adjusting the error correction coding scheme based on the copy of the feedback. In some embodiments, the signal bearing medium 902 of the one or more computer program products 900 include a computer readable medium 906, a recordable medium 908, and/or a communications medium 910.

While the subject matter described herein is presented in the general context of program modules that execute in conjunction with the execution of an operating system and application programs on a computer system, those skilled in the art will recognize that other implementations may be performed in combination with other types of program modules. Generally, program modules include routines, programs, components, data structures, and other types of structures that perform particular tasks or implement particular abstract data types. Moreover, those skilled in the art will appreciate that the subject matter described herein may be practiced with other computer system configurations, including hand-held devices, multi-core processor systems, microprocessor-based or programmable consumer electronics, minicomputers, mainframe computers, and the like.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method to adapt an error correction coding scheme, comprising:

receiving a message;

generating a portion of a codeword by encoding the message based on the error correction coding scheme;

transmitting the message and the portion of the codeword to a receiver via a feedforward communications channel, wherein the receiver is configured to receive the transmitted portion of the codeword as a received codeword, and decode the received codeword based on the error correction coding scheme to decode the message;

receiving feedback from the receiver via a feedback communications channel, wherein the feedback includes at least one portion of the received codeword;

comparing the feedback to the transmitted portion of the codeword; and in response to a determination that the feedback is different from the transmitted portion of the codeword to an extent that the decoded message does not match the message, identifying an error in the feedback based on the comparison of the feedback to the transmitted portion of the codeword by determining that received symbols in the feedback do not match transmitted symbols in the transmitted portion of the codeword;

adapting the error correction coding scheme according to modifications determined to compensate for the error, wherein the modifications include adjustment of an amplitude for adapted symbols to cause the received symbols in the feedback to match the transmitted symbols in the transmitted portion of the codeword; and generating an additional portion of the codeword by encoding the message based on the adapted error correction coding scheme, wherein the additional portion of the codeword includes the adapted symbols of the adjusted amplitude.

2. The method of claim 1, further comprising:
transmitting the message and the additional portion of the codeword to the receiver via the feedforward communications channel, wherein the receiver is configured to receive the additional transmitted portion of the codeword as another received codeword, and decode the other received codeword based on the adapted error correction coding scheme to decode the message.

3. The method of claim 2, further comprising:
receiving additional feedback from the receiver via a feedback communications channel, wherein the additional feedback includes at least one portion of the other received codeword;
comparing the additional feedback to the additional transmitted portion of the codeword; and
in response to a determination that the additional feedback is different from the additional transmitted portion of the codeword to an extent that the decoded message does not match the message,
identifying an error in the additional feedback based on the comparison of the additional feedback to the additional transmitted portion of the codeword; and
upon identifying the error in the additional feedback, increasing transmission power of messages from the transmitter to the receiver.

4. The method of claim 1, wherein the error in the feedback comprises degradation of the transmitted portion of the codeword caused by the feedforward channel.

5. The method of claim 1, wherein the receiver is configured to generate the feedback by quantizing the transmitted portion of the codeword.

6. The method of claim 1, wherein the error correction coding scheme comprises a polar coding scheme; and wherein the adapted error correction coding scheme comprises an adapted polar coding scheme.

7. The method of claim 1, wherein a transmitter comprises a low power transmitter having a power constraint; and wherein the receiver comprises a high power receiver without the power constraint.

8. A system to adapt an error correction coding scheme, comprising:
a transmitter comprising an encoding device and a coding scheme designer;
a receiver comprising a decoding device and a feedback signal generator, the receiver coupled to the transmitter via a feedforward communications channel and a feedback communications channel;
wherein the encoding device is configured to receive a message, encode the message based on the error correction coding scheme to generate a portion of a codeword, transmit the message and the portion of the codeword to the decoding device and the feedback signal generator via the feedforward communications channel, receive an adaptive parameter selection signal associated with a portion of the codeword that is quantized from the coding scheme designer, adapt the error correction coding scheme by adjustment of a parameter of the error correction coding scheme in accordance with the adaptive parameter selection signal, and encode an additional portion of the codeword using the adapted error correction coding scheme;

wherein the decoding device is configured to receive the transmitted portion of the codeword as a received codeword from the encoding device via the feedforward communications channel and decode the received codeword based on the error correction coding scheme to decode the message;

wherein the feedback signal generator is configured to receive the transmitted portion of the codeword from the encoding device via the feedforward communications channel, generate feedback that includes at least one portion of the received codeword, and transmit the feedback to the coding scheme designer via the feedback communications channel; and wherein the coding scheme designer associated with the transmitter is configured to receive the feedback from the feedback signal generator via the feedback communications channel, compare the feedback to the transmitted portion of the codeword, and in response to a determination that the feedback is different from the transmitted portion of the codeword to an extent that the decoded message does not match the message: identify an error in the feedback based on the comparison of the feedback to the transmitted portion of the codeword by determining that received symbols in the feedback do not match transmitted symbols in the transmitted portion of the codeword, generate the adaptive parameter selection signal configured to instruct the encoding device to adjust the parameter of the error correction coding scheme from a set amplitude of the transmitted symbols in the transmitted portion of the codeword to an adjusted amplitude for adapted symbols in the additional portion of the codeword to compensate for the error, and transmit the adaptive parameter selection signal to the encoding device.

9. The system of claim 8, wherein the encoding device is further configured to transmit the additional portion of the codeword to the decoding device and the feedback signal generator via the feedforward communications channel.

10. The system of claim 8, wherein the feedback signal generator is further configured to receive the additional transmitted portion of the codeword as another received codeword from the encoding device via the feedforward communications channel, generate additional feedback based on the other received codeword, and transmit the additional feedback to the coding scheme designer via the feedback communications channel; and wherein the coding scheme designer is further configured to receive the additional feedback from the feedback signal generator via the feedback communications channel, identify an error in the additional feedback based on a comparison of the feedback to the additional transmitted portion of the codeword, and when the error in the additional feedback is identified, increase transmission power of messages from the transmitter to the receiver.

11. The system of claim 8, wherein the error in the feedback is caused by degradation of the transmitted portion of the codeword in the feedforward communications channel.

12. The system of claim 8, wherein the feedback signal generator is configured to generate the feedback by quantizing the transmitted portion of the codeword.

13. The system of claim 8, wherein the error correction coding scheme comprises a polar coding scheme; and wherein the adapted error correction coding scheme comprises an adapted polar coding scheme.

14. The system of claim 8, wherein the transmitter comprises a low power transmitter having a power constraint; and wherein the receiver comprises a high power receiver without the power constraint.

15. A non-transitory computer-readable medium having computer-executable instructions stored thereon which, when executed by a computer, cause the computer to:
    generate a portion of a codeword by encoding a message based on an error correction coding scheme;
    transmit, at a set power level, the message and the portion of the codeword to a receiver via a feedforward communications channel, wherein the receiver is configured to receive the transmitted portion of the codeword as a received codeword, and decode the received codeword based on the error correction coding scheme to decode the message;
    receive feedback from the receiver via a feedback communications channel, wherein the feedback includes at least one portion of the received codeword;
    compare the feedback to the transmitted portion of the codeword; and
    in response to a determination that the feedback is different from the transmitted portion of the codeword to an extent that the decoded message does not match the message,
        identify an error in the feedback based on the comparison of the feedback to the transmitted portion of the codeword by determining that received symbols in the feedback do not match transmitted symbols in the transmitted portion of the codeword;
        adapt the error correction coding scheme according to modifications determined to compensate for the error, wherein the modifications include adjustment of an amplitude for adapted symbols to cause the received symbols in the feedback to match the transmitted symbols in the transmitted portion of the codeword;
        generate an additional portion of the codeword by encoding the message based on the adapted error correction coding scheme, wherein the additional portion of the codeword includes the adapted symbols of the adjusted amplitude; and
        transmit, at the set power level, the additional portion of the codeword to the receiver via the feedforward communications channel, wherein the receiver is configured to receive the additional transmitted portion of the codeword as another received codeword.

16. The non-transitory computer-readable medium of claim 15, having computer-executable instructions stored thereon which, when executed by the computer, further cause the computer to:
    receive additional feedback generated by the receiver via the feedback communications channel, wherein the additional feedback is based at least in part on the other received codeword;
    identify an error in the additional feedback compared to the additional transmitted portion of the codeword;
    when the error in the additional feedback compared to the additional transmitted portion of the codeword is identified, increase transmission power of the transmitter from the set power level to an adjusted power level; and
    transmit, at the adjusted power level, a subsequent portion of the message from the transmitter to the receiver.

17. A method to adapt an error correction coding scheme, comprising:
    receiving a message;
    generating a codeword that includes multiple bits by encoding the message based on the error correction coding scheme;
    selecting, via a switch instructed by a previous index of the codeword, a symbol that represents a first portion of the codeword;
    transmitting the message and the symbol to the receiver via a feedforward communications channel, wherein the receiver is configured to receive the transmitted symbol as a received symbol, and decode the received symbol based at least in part on the error correction coding scheme to decode the message;
    receiving feedback from the receiver via a feedback communications channel that is coupled to an input of the switch, wherein the feedback includes a next index of the codeword generated based on channel observations of the feedforward communications channel indicated by the received symbol;
    comparing the feedback to the transmitted symbol; and
    in response to a determination that the feedback is different from the transmitted symbol to an extent that the decoded message does not match the message,
        identifying an error in the feedback based on the comparison of the feedback to the transmitted symbol by determining that the received symbol in the feedback does not match the transmitted symbol;
        adapting the error correction coding scheme according to modifications determined to compensate for the error, wherein the modifications include adjustment of an amplitude for an adapted symbol to cause the received symbol in the feedback to match the transmitted symbol; and
    selecting, via the switch instructed by the next index, the adapted symbol of the adjusted amplitude as a next symbol that represents an additional portion of the codeword to be transmitted to the receiver.

18. The method of claim 17, wherein generating the codeword by encoding the message based on the error correction coding scheme comprises:
    generating an error detection codeword by encoding the message based on an error detection coding scheme; and
    generating the codeword by encoding the error detection codeword based on the error correction coding scheme.

19. The method of claim 18, wherein generating the error detection codeword by encoding the message based on the error correction coding scheme comprises:
    dividing the message into a plurality of sub-strings; and
    generating a parity check bit for each of the plurality of sub-strings, the error detection codeword comprising the plurality of sub-strings and the corresponding parity check bits.

20. The method of claim 19, wherein the symbol comprises a bit.

21. The method of claim 17, wherein the error correction coding scheme comprises a polar coding scheme.

22. The method of claim 17, wherein a transmitter comprises a low power transmitter having a power constraint; and wherein the receiver comprises a high power receiver without the power constraint.

23. The method of claim 17, wherein the next index of the codeword is equivalent to the previous index of the codeword.

24. The method of claim 17, wherein the channel observations indicate degradation of the received symbol caused by the feedforward channel.

25. The method of claim 17, wherein the next index of the codeword is generated based on the channel observations such that an error probability upper bound is minimized.

26. The method of claim 25, wherein the error probability upper bound is based on a Bhattacharyya parameter.

27. A system to adapt an error correction coding scheme, comprising:
- a transmitter comprising an encoding device, a transmission module, and a switch;
- a receiver comprising a decoding device and an index determination module, the receiver coupled to the transmitter via a feedforward communications channel and a feedback communications channel that is coupled to an input of the switch;
- wherein the encoding device is configured to receive a message, generate a codeword by encoding the message based at least in part on the error correction coding scheme, and provide the codeword to the transmission module;
- wherein the transmission module is configured to select, via the switch instructed by a previous index of the codeword, a symbol that represents a first portion of the codeword, transmit the message and the symbol to the receiver, select, via the switch instructed by a next index, a next symbol that represents an additional portion of the codeword, and transmit the message and the next symbol to the receiver;
- wherein the index determination module is configured to receive the symbol as a received symbol, generate the next index of the codeword based on channel observations of the feedforward communications channel indicated by the received symbol, and transmit the next index of the codeword to the transmitter via the feedback communications channel
- wherein the switch is configured to receive feedback including the received symbol from the index determination module, compare the feedback to the transmitted symbol, and in response to a determination that the feedback is different from the transmitted symbol to an extent that a decoded message does not match the message: identify an error in the feedback based on the comparison of the feedback to the transmitted symbol by determining that the received symbol in the feedback does not match the transmitted symbol, adapt the error correction coding scheme according to modifications determined to compensate for the error, wherein the modifications include adjustment of an amplitude for an adapted symbol to cause the received symbol in the feedback to match the transmitted symbol, and instruct the transmission module to select the adapted symbol of the adjusted amplitude as the next symbol; and
- wherein the decoding device is configured to receive multiple symbols of the codeword from the encoding device via the feedforward communications channel, the multiple symbols including the symbol and the next symbol, and decode the multiple symbols based at least in part on the error correction coding scheme to generate the decoded message.

28. The system of claim 27, wherein the error correction coding scheme comprises a polar coding scheme.

29. The system of claim 27, wherein the transmitter comprises a low power transmitter having a power constraint; and wherein the receiver comprises a high power receiver without the power constraint.

30. The system of claim 27, wherein the next index of the codeword is equivalent to the previous index of the codeword.

31. The system of claim 27, wherein the channel observations indicate degradation of the received symbol caused by the feedforward communications channel.

32. The system of claim 27, wherein the symbol comprises a bit.

* * * * *